United States Patent
Floriani et al.

(10) Patent No.: US 12,362,735 B2
(45) Date of Patent: Jul. 15, 2025

(54) CONTROLLER WITH PROTECTION AGAINST CROSS-CONDUCTION FOR AN ELECTRONIC CIRCUIT INCLUDING A PAIR OF SWITCHES AND RELATED CONTROL METHOD

(71) Applicant: STMicroelectronics S.r.l., Agrate Brianza (IT)

(72) Inventors: Ivan Floriani, Milan (IT); Elena Brigo, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/451,262

(22) Filed: Aug. 17, 2023

(65) Prior Publication Data

US 2024/0088876 A1     Mar. 14, 2024

(30) Foreign Application Priority Data

Sep. 14, 2022    (IT) .................. 102022000018801

(51) Int. Cl.
| | |
|---|---|
| *H03K 3/037* | (2006.01) |
| *H03K 5/1534* | (2006.01) |
| *H03K 7/08* | (2006.01) |
| *H03K 17/687* | (2006.01) |

(52) U.S. Cl.
CPC ......... *H03K 3/0375* (2013.01); *H03K 5/1534* (2013.01); *H03K 7/08* (2013.01); *H03K 17/6871* (2013.01)

(58) Field of Classification Search
CPC ...... H03K 3/0375; H03K 5/1534; H03K 7/08; H03K 17/6871; H03K 17/94; H03K 3/02; H03K 19/173; H02M 3/158; H02M 7/5387; H02M 1/38
See application file for complete search history.

(56) References Cited

U.S. PATENT DOCUMENTS

| | | |
|---|---|---|
| 7,437,800 B2 | 10/2008 | Ham |
| 2014/0136876 A1 | 5/2014 | Steedman et al. |
| 2022/0209674 A1 | 6/2022 | Wang et al. |

FOREIGN PATENT DOCUMENTS

JP        2960744 B2 * 10/1999

* cited by examiner

*Primary Examiner* — Metasebia T Retebo
(74) *Attorney, Agent, or Firm* — Slater Matsil, LLP

(57) ABSTRACT

A controller for an electronic circuit that includes a first and a second switch is provided. The controller includes an event detector stage that receives logic electrical signals and a pulse generator circuit, which is coupled to the event detector stage and generates a dead time signal based on edges of the logic electrical signals detected by the event detector stage. The dead time signal includes pulses delimited by an edge of a first type and by a subsequent edge of a second type. A combinatorial sampling circuit generates a first and a second sampled preliminary signal. An update stage updates the values of the first and the second control signals at each pulse of the dead time signal based on the first and the second sampled preliminary signals, subsequently to the edge of the first type or the second type of the pulse of the dead time signal.

20 Claims, 16 Drawing Sheets

| In1 | In2 | In3 | Out1 | Out2 | Out3 | Out4 |
|---|---|---|---|---|---|---|
| 0 | 0 | 0 | 1 | 0 | 1 | 0 |
| 0 | 0 | 1 | 0 | 1 | 1 | 0 |
| 0 | 1 | 0 | 0 | 0 | 1 | 0 |
| 0 | 1 | 1 | 1 | 1 | 0 | 0 |
| 1 | 0 | 0 | 1 | 0 | 1 | 0 |
| 1 | 0 | 1 | 1 | 0 | 0 | 1 |
| 1 | 1 | 0 | 1 | 0 | 0 | 0 |
| 1 | 1 | 1 | 1 | 1 | 0 | 0 |

FIG. 12

CONTROLLER WITH PROTECTION AGAINST CROSS-CONDUCTION FOR AN ELECTRONIC CIRCUIT INCLUDING A PAIR OF SWITCHES AND RELATED CONTROL METHOD

CROSS-REFERENCE TO RELATED APPLICATIONS

This application claims priority to Italian Application No. 102022000018801, filed on Sep. 14, 2022, which application is hereby incorporated herein by reference.

TECHNICAL FIELD

The present disclosure generally relates to a controller with protection against cross-conduction for an electronic circuit including at least a pair of switches, and to a corresponding control method.

BACKGROUND

As is known, nowadays numerous electronic circuits are available, which may be subject to the phenomenon of cross-conduction, that is to the occurrence of the situation wherein, given a pair of switches connected in series between a power supply and the ground, both switches are on, resulting in the creation of an unwanted path between the power supply and the ground.

For example, the phenomenon of cross-conduction is well known in the field of so-called DC-DC converters, also known as switching converters, which allow generating, from a DC input voltage, an output voltage, which is of the DC-type, may be higher or lower than the input voltage and may be applied to a load.

Summary In various embodiments, the present disclosure provides a controller for an electronic circuit including at least a pair of switches, which at least partially overcomes the drawbacks of the prior art.

In at least one embodiment, a controller is provided for an electronic circuit that includes a first and a second driving circuit and a first and a second switch connected in series between a power supply node and a node at a reference potential. The first driving circuit is configured to receive a first control signal and to turn on or off the first switch when the first control signal is respectively equal to a first or a second logic value, and the second driving circuit is configured to receive a second control signal and to turn on or off the second switch when the second control signal is respectively equal to the first or the second logic value. The controller is configured to couple to a plurality of internal circuits configured to generate corresponding logic electrical signals including respective edges. The controller includes an event detector circuit and a pulse generator circuit. The pulse generator circuit is coupled to the event detector circuit and is configured to generate a dead time signal and to control the event detector circuit to operate in a first operating mode or a second operating mode. The event detector circuit is configured to detect an occurrence of the edge of any of the logic electrical signals in the first operating mode, and the event detector circuit is insensitive to the edges of the logic electrical signals in the second operating mode. The pulse generator circuit is further configured to generate, when the event detector circuit operates in the first operating mode and following the detection of the edge of any of the logic electrical signals by the event detector circuit, a corresponding pulse of the dead time signal, which is delimited by an edge of a first type and by a subsequent edge of a second type. The pulse generator circuit is further configured to control the event detector circuit to operate in the second operating mode during each pulse of the dead time signal and to operate in the first operating mode between pulses of the dead time signal. A combinatorial sampling circuit is configured to generate, based on a truth table and the logic electrical signals, a first and a second sampled preliminary signal. The first and the second sampled preliminary signals have values that are updated at each edge of the first type of the dead time signal based on the truth table and values of the logic electrical signals at the edge of the first type of the dead time signal. An update circuit is coupled to the combinatorial sampling circuit and to the pulse generator circuit and is configured to update, at each pulse of the dead time signal, the values of the first and the second control signals. If, with respect to the values of the first or the second sampled preliminary signal relating to a preceding pulse of the dead time signal, a switching has occurred from the first to the second logic value of the first or the second sampled preliminary signal, the update includes causing a corresponding switching from the first to the second logic value respectively of the first or the second control signal, subsequently to the edge of the first type of the pulse of the dead time signal. If, with respect to the values of the first or the second sampled preliminary signal relating to the preceding pulse of the dead time signal, a switching has occurred from the second to the first logic value of the first or the second sampled preliminary signal, the update includes causing a corresponding switching from the second to the first logic value respectively of the first or the second control signal, subsequently to the edge of the second type of the pulse of the dead time signal.

In at least one embodiment, a switching converter is provided that includes a first driving circuit configured to receive a first control signal and to control a first switch based on the first control signal having a first or a second logic value. A second driving circuit is configured to receive a second control signal and to control a second switch based on the second control signal having the first or the second logic value. The first and second switches are connected in series between a power supply node and a node at a reference potential. A controller is configured to receive logic electrical signals including respective edges. The controller includes an event detector circuit and a pulse generator circuit. The pulse generator circuit is coupled to the event detector circuit and is configured to generate a dead time signal and to control the event detector circuit to operate in a first operating mode or a second operating mode. The event detector circuit is configured to detect an occurrence of the edge of any of the logic electrical signals in the first operating mode, and the event detector circuit is insensitive to the edges of the logic electrical signals in the second operating mode. The pulse generator circuit is further configured to generate, in response to the event detector circuit detecting the edge of any of the logic electrical signals in the first operating mode, a corresponding pulse of the dead time signal having a first edge of a first type and a subsequent second edge of a second type. The pulse generator circuit is further configured to control the event detector circuit to operate in the second operating mode during each pulse of the dead time signal and to operate in the first operating mode between pulses of the dead time signal. A combinatorial sampling circuit is configured to generate, based on a truth table and the logic electrical signals, a first and a second sampled preliminary signal. The first and the second sampled preliminary signals have values that are updated at each edge of the first type of the dead time signal based on the truth table and values of the logic electrical signals at the edge of the first type of the dead time signal. An update circuit is coupled to the combinatorial sampling circuit and to the pulse generator circuit and is configured to update, at each pulse of the dead time signal, the values of the first and the second control signals. In response to a switching having occurred from the first to the second logic value of the first or the second sampled preliminary signal, the update includes causing a corresponding switching from the first to the second logic value of the first or the second control signal, subsequently to the edge of the first type of the pulse of the dead time signal. In response to a switching having occurred from the second to the first logic value of the first or the second sampled preliminary signal, the update includes causing a corresponding switching from the second to the first logic value of the first or the second control signal, subsequently to the edge of the second type of the pulse of the dead time signal.

In at least one embodiment, a method is provided for controlling an electronic circuit. The method includes: receiving a plurality of logic electrical signals including respective edges; controlling an event detector circuit to operate in a first operating mode or a second operating mode, the event detector circuit being configured to detect an occurrence of an edge of any of the logic electrical signals in the first operating mode, and the event detector circuit being insensitive to the edges of the logic electrical signals in the second operating mode; generating a dead time signal, the generating the dead time signal including generating, when the event detector circuit operates in the first operating mode and following the detection of an edge of any of the logic electrical signals by the event detector circuit, a corresponding pulse of the dead time signal, which is delimited by an edge of a first type and by a subsequent edge of a second type; controlling the event detector to operate in the second operating mode during each pulse of the dead time signal and to operate in the first operating mode between pulses of the dead time signal; generating, based on a truth table and the logic electrical signals, a first and a second sampled preliminary signal, the first and the second sampled preliminary signals having values that are updated at each edge of the first type of the dead time signal based on the truth table and values of the logic electrical signals at the edge of the first type of the dead time signal; and generating a first and a second control signal based on the first and, respectively, the second sampled preliminary signal, the electronic circuit including a first driving circuit configured to control a first switch based on the first control signal having a first or a second logic value and a second driving circuit configured to control a second switch based on the second control signal having the first or the second logic value. Generating the first and second control signals comprises updating, at each pulse of the dead time signal, the values of the first and the second control signals, the updating comprising: in response to a switching having occurred from the first to the second logic value of the first or the second sampled preliminary signal, causing a corresponding switching from the first to the second logic value of the first or the second control signal, subsequently to the edge of the first type of the pulse of the dead time signal; and in response to a switching having occurred from the second to the first logic value of the first or the second sampled preliminary signal, causing a corresponding switching from the second to the first logic value of the first or the second control signal, subsequently to the edge of the second type of the pulse of the dead time signal.

BRIEF DESCRIPTION OF THE DRAWINGS

For a more complete understanding of one or more embodiments of the present disclosure, and the advantages thereof, reference is now made to the following descriptions taken in conjunction with the accompanying drawings, in which:

FIG. 12 shows a truth table, in accordance with one or more embodiments;

DETAILED DESCRIPTION OF ILLUSTRATIVE EMBODIMENTS

Figure 1:
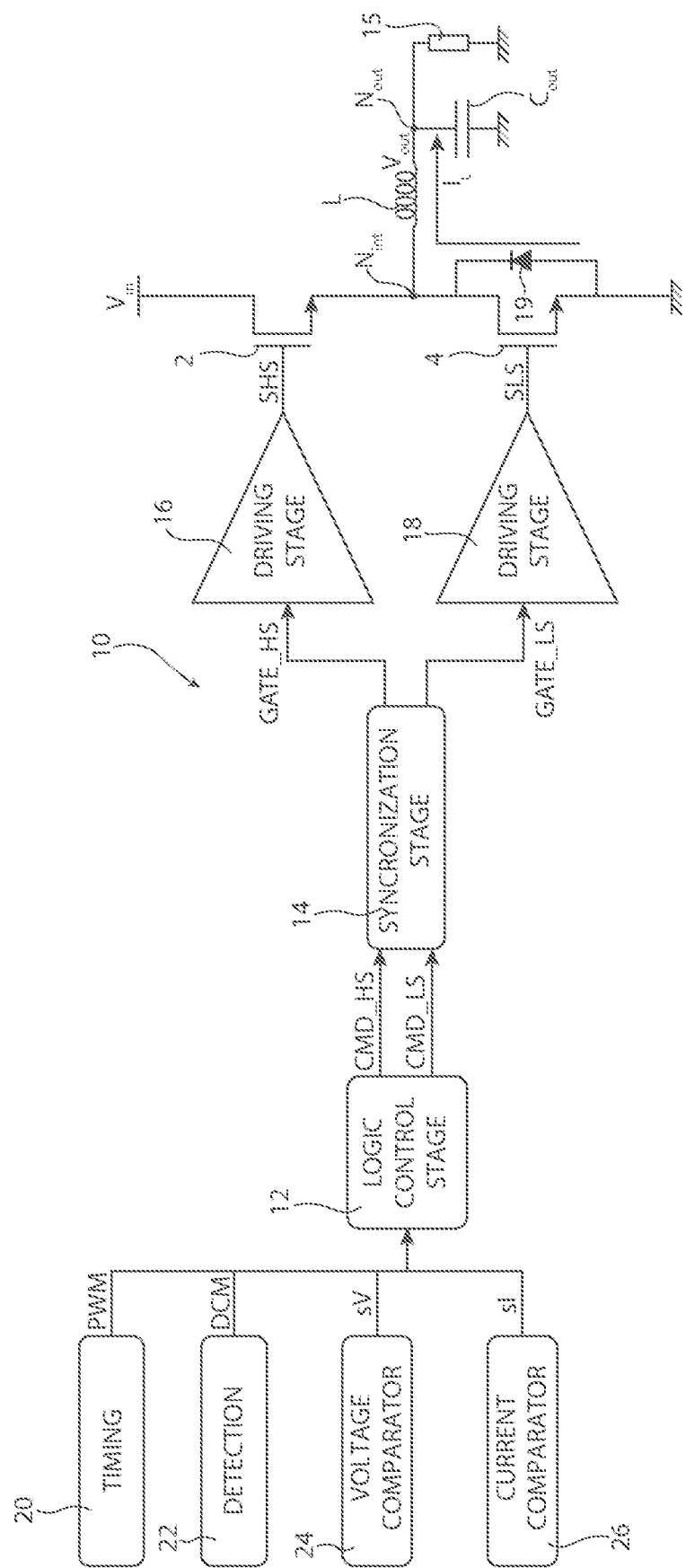
FIG. 1 shows a circuit diagram of a switching converter of a comparative example.

Cross-conduction represents an undesired scenario in the so-called synchronous switching converters, which are characterized by that they provide for the driving of both the so-called "high side" and the so-called "low side", as explained hereinafter with reference, for example, to a converter 1 of a comparative example shown in FIG. 1.

In detail, the converter 1 comprises two NMOS transistors, which are for example power MOSFET transistors, and which are hereinafter referred to as the top transistor 2 and the bottom transistor 4, respectively.

The source terminal of the top transistor 2 is connected to the drain terminal of the bottom transistor 4, so as to respectively form an internal node $N_{int}$. The drain terminal of the top transistor 2 is set at a supply voltage $V_{in}$, while the source terminal of the bottom transistor 4 is set to ground. In other words, the top transistor 2 and the bottom transistor 4 are connected in series. Furthermore, FIG. 1 also shows the body diode (indicated by 19) of the bottom transistor 2.

The converter 1 further comprises an inductor L and an output capacitor $C_{out}$. A first terminal of the inductor L is connected to the internal node Nit, while a second terminal of the inductor L is connected to a first terminal of the output capacitor $C_{out}$, so as to form an output node $N_{out}$; the second terminal of the output capacitor $C_{out}$ is connected to ground.

The converter 1 further comprises a control module 10, which comprises a logic control stage 12, a synchronization stage 14, a top driving stage 16 and a bottom driving stage 18. Furthermore, the control module 10 comprises a plurality of internal circuits, which are configured to generate corresponding electrical signals, which are provided at input to the logic control stage 12. For example, the converter 1 comprises a timing circuit 20, a detection circuit 22, a voltage comparator circuit 24 and a current comparator circuit 26. However, other circuits may be present, for generating other electrical signals; furthermore, one or more of the timing circuit 20, the detection circuit 22, the voltage comparator circuit 24 and the current comparator circuit 26 may be absent.

In use, the output node $N_{out}$ is coupled to a load 15, which is interposed between the output node $N_{out}$ and the ground. Furthermore, an output voltage $V_{out}$ is present on the output node $N_{out}$; the current which flows in the inductor L is instead indicated by $I_L$.

The timing circuit 20, the detection circuit 22, the voltage comparator circuit 24 and the current comparator circuit 26 are configured to generate, respectively, a signal PWM, a signal DCM, a signal sV and a signal sI. The signal PWM is a timing signal, whereon, as explained hereinbelow, the turn-on and -off of the top transistor 2 and the bottom transistor 4 depend. The signal DCM is a logic signal indicative of possible sign inversions of the current $I_L$. The signal sV is a logic signal indicative of a comparison between a reference voltage (not shown) and the output voltage $V_{out}$ (or a voltage that linearly depends on the latter). The signal sI is a logic signal indicative of a comparison between a reference current (not shown) and the current $I_L$.

On the basis of the signals PWM, DCM, sV and sI, the logic control stage 12 generates a signal CMD_HS and a signal CMD_LS, which in the present example are assumed to be the logical negation of one another. In practice, the signals PWM, DCM, sV and sI represent an n-tuple (with n=4) of logic input signals of the logic control stage 12, on the basis of which the logic control stage 12 generates an m-tuple (with m=2) of respective logic output signals.

The synchronization stage 14 receives the signals CMD_HS and signal CMD_LS and generates a first logic control signal GATE_HS and a second logic control signal GATE_LS, which are provided at input to the top and, respectively, to the bottom driving stage 16, 18. The outputs of the top and the bottom driving stages 16, 18 are connected respectively to the gate terminals of the top transistor 2 and the bottom transistor 4.

In greater detail, the top and the bottom driving stages 16, 18 generate, on the respective outputs, a signal SHS and a signal SLS, which are therefore respectively applied to the gate terminals of the top transistor 2 and of the bottom transistor 4. In particular, when the first logic control signal GATE_HS is respectively equal to '1' or '0', the signal SHS present on the gate terminal of the top transistor 2 is respectively equal to a voltage $V_{on\_hs}$ or to a voltage $V_{off\_hs}$, which are such that the top transistor 2 is respectively on or off. Similarly, when the second logic control signal GATE_LS is respectively equal to '1' or '0', the signal SLS present on the gate terminal of the bottom transistor 4 is respectively equal to a voltage $V_{on\_ls}$ is or a voltage $V_{off\_ls}$, which are such that the bottom transistor 2 is respectively on or off.

In particular, when the top transistor 2 is on and the bottom transistor 4 is off (case not shown), i.e. during a so-called time interval $T_{ON}$, the current $I_L$ flows in the top transistor 2 and rises linearly over time; the inductor L then undergoes a charging process. Furthermore, when the top transistor 2 is off and the bottom transistor 4 is on (case shown in FIG. 1), i.e. during a so-called time interval $T_{OFF}$, the current $I_L$ flows in the bottom transistor 2 and decreases linearly over time; the inductor L then undergoes a discharging process.

In practice, the signals CMD_HS and CMD_LS control the turn-on and -off of the top transistor 2 and the bottom transistor 4. However, the top driving stage 16 and the bottom driving stage 18 are not directly controlled by the signals CMD_HS and CMD_LS, but, as previously said, by the first and the second logic control signals GATE_HS, GATE_LS, for the reasons explained hereinbelow.

Figure 2:
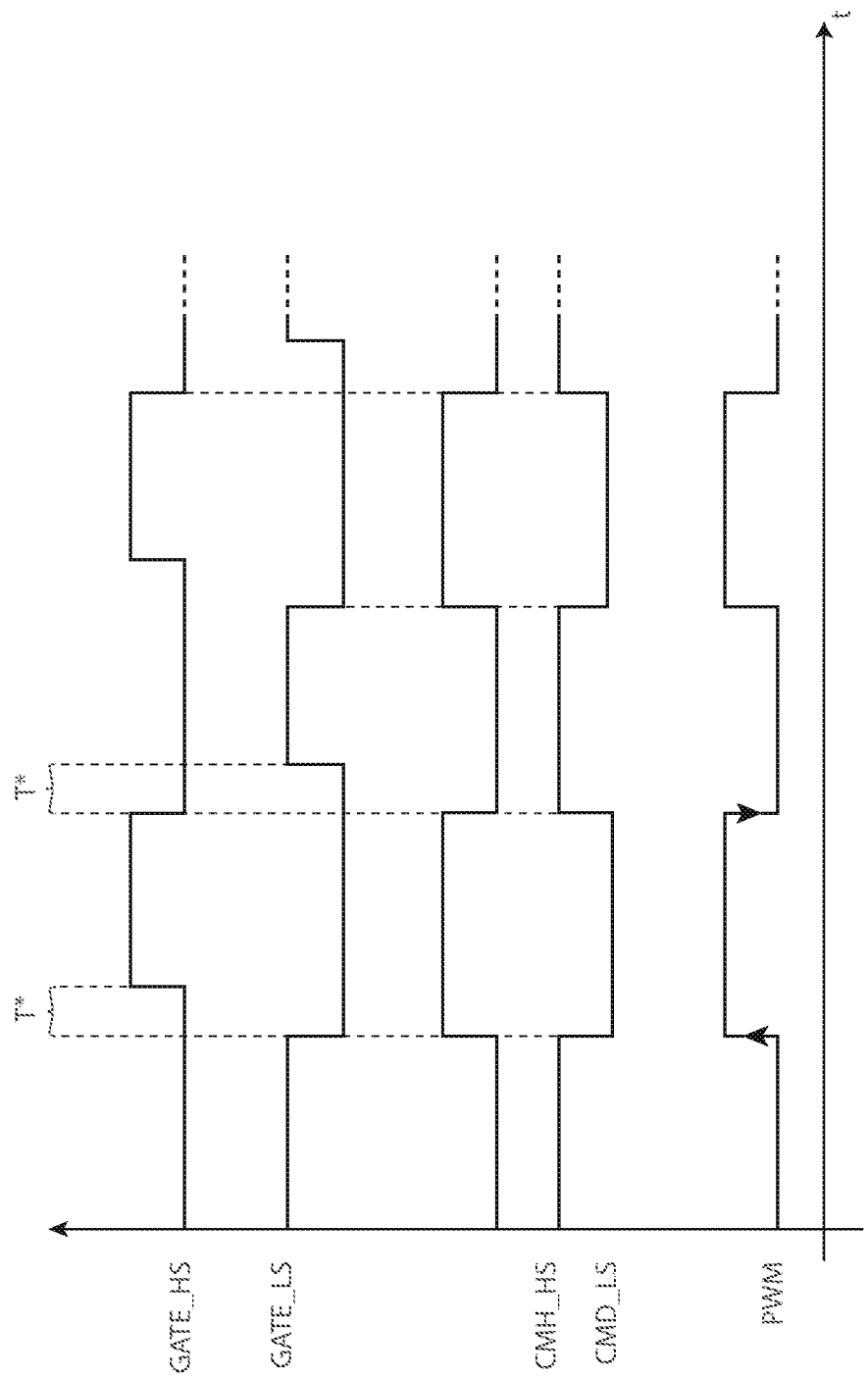
FIG. 2 shows trends over time of electrical signals with respect to the switching converter of FIG. 1.

In detail, as shown in FIG. 2, the signal PWM represents a clock signal, whose period represents the so-called switching time. The signal PWM times the charge and discharge cycles of the inductor L. Since the edges of the signals CMD_HS and CMD_LS are substantially aligned, if the turn-on/off of the top transistor 2 and the bottom transistor 4 were controlled directly by the signals CMD_HS and CMD_LS, cross-conduction situations might occur, i.e. situations wherein the top transistor 2 and the bottom transistor 4 are turned on simultaneously, resulting in the creation of an undesired conductive path (as a first approximation, a short-circuit) between the drain terminal of the top transistor 2, set at the supply voltage $V_{in}$, and the ground, with the resulting risk of damaging the top transistor 2 and the bottom transistor 4. To prevent the occurrence of such cross-conduction situations, the top driving stage 16 and the bottom driving stage 18 are respectively controlled by the first and the second logic control signals GATE_HS, GATE_LS, which are generated by the synchronization stage 14 in such a way that the rising edge of each pulse of the first logic control signal GATE_HS occurs only after a time interval T* has elapsed with respect to a preceding falling edge of the second logic control signal GATE_LS, the subsequent rising edge of the second logic control signal GATE_LS occurring with a delay equal to the time interval T* with respect to the falling edge of the pulse of the first logic control signal GATE_HS. In other words, the first logic control signal GATE_HS goes to '1' with a delay equal to the time interval T* with respect to the time instant wherein the second logic control signal GATE_LS went to '0'; furthermore, the second logic control signal GATE_LS returns to '1' with a delay equal to the time interval T* with respect to the time instant wherein the first logic control signal GATE_LS returned to '0'. In this manner it is ensured that the top transistor 2 is on only when the bottom transistor 4 is off.

For example, as indeed shown in FIG. 2, the second logic control signal GATE_LS may be generated so that its falling edges coincide with the falling edges of the signal CMD_LS and its rising edges are delayed by the time interval T* with respect to the rising edges of the signal CMD_LS. Similarly, the first logic control signal GATE_HS may be generated so that its rising edges are delayed by the time interval T* with respect to the rising edges of the signal CMD_HS and its falling edges coincide with the falling edges of the signal CMD_HS. However, this requires or otherwise relies on having a high-frequency (much higher than the frequency of the signal PWM) timing signal, which cannot always be easily implemented, particularly in the case of switching converters which operate with a high switching frequency.

A different solution for preventing the cross-conduction provides for monitoring the gate-source and drain-source voltages of the top transistor 2 and of the bottom transistor 4, so as to detect the turn-off of the bottom transistor 4, before turning on the top transistor 2, as well as the turn-off of the top transistor 2, before turning on the bottom transistor 4. However, this solution is considerably more complicated from the circuit point of view.

Hereinafter, unless where otherwise specified, various embodiments of a controller (which may be referred to herein as a control module) are described, purely by way of example, with reference to the case wherein it forms a converter of the same type shown in FIG. 1. In particular, the present control module, indicated by 100, is initially described with reference to FIG. 3, wherein purely by way of example it is assumed that the internal circuits of the control module 100 include the timing circuit (here indicated by 120), the detection circuit (here indicated by 122), an overvoltage detection circuit 123 and a mode adjustment circuit 125. In particular, the overvoltage circuit 123 generates a signal OV, which is a logic signal indicative of the exceeding, by the output voltage $V_{out}$, of a respective threshold; the mode adjustment circuit 125 generates a signal REG_MODE, which is a logic signal indicative of an operating mode. However, other embodiments are possible, wherein other internal circuits are present, for generating other electrical signals; furthermore, one or more of the timing circuit 120, the detection circuit 122, the overvoltage detection circuit 123 and the mode adjustment circuit 125 may be absent. Furthermore, it is anticipated that other embodiments, described hereinbelow, are possible wherein the control module is used to control an electronic circuit other than a switching converter.

All this having been said, the timing circuit 120, the detection circuit 122, the overvoltage detection circuit 123 and the mode adjustment circuit 125 represent circuits whose inputs are coupled to corresponding nodes of the control module 100, these circuits generating in a per se known manner corresponding logic signals whose edges are asynchronous to each other.

The control module 100 includes a variety of different circuits or "stages." For example, as shown, the control module 100 includes a logic control stage 112, which comprises an event detector stage 130, a pulse generator circuit 132, a memory stage 133, a combinatorial stage 134 and a synchronization stage 136.

In detail, the inputs of the event detector stage 130 and the combinatorial stage 134 are connected to the outputs of the timing circuit 120, the detection circuit 122, the overvoltage detection circuit 123 and the mode adjustment circuit 125. Consequently, both the event detector stage 130 and the combinatorial stage 134 receive at input the signal PWM, the signal DCM, the signal OV and the signal REG_MODE. The event detector stage 130 also has an input connected to the output of the pulse generator circuit 132; in this regard, it is anticipated that the pulse generator circuit 132 is configured to generate a signal sPULSE on its output.

Figure 4:
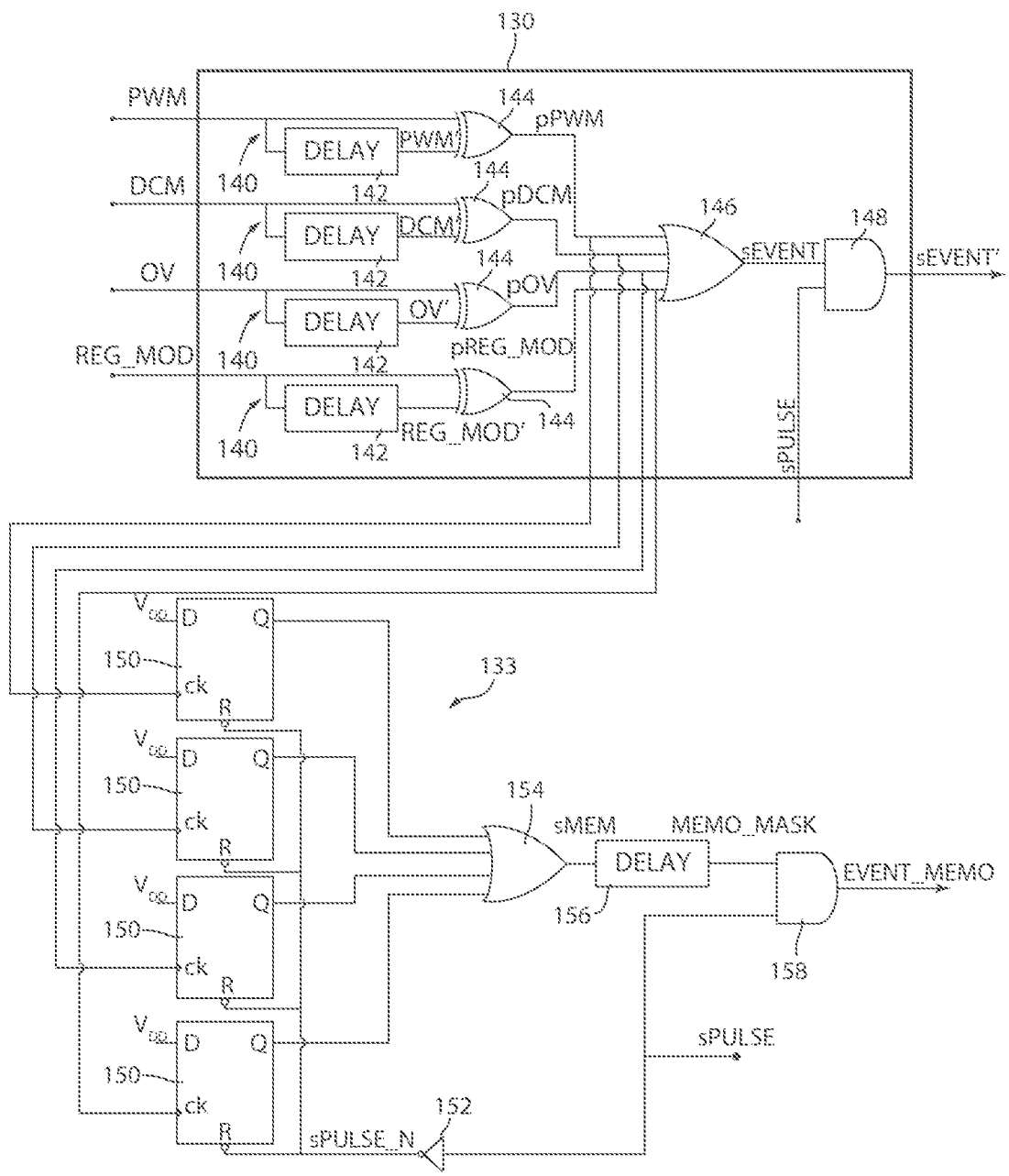
FIGS. 4, 7, 9 and 14 show circuit diagrams of portions of the control module shown in FIG. 3, in accordance with one or more embodiments.

As shown in FIG. 4, the event detector stage 130 may comprise for example four base circuits 140, equal to each other and configured to receive, respectively, the signal PWM, the signal DCM, the signal OV and the signal REG_MODE on its inputs. Each base circuit 140 comprises: a respective EXOR logic circuit 144, which has a first input terminal connected to the input of the respective base circuit 140, the output terminal of the EXOR logic circuit 144 forming the output of the base circuit 140; and a respective delay circuit 142, which has an input terminal, connected to the input of the respective base circuit 140, and an output terminal, which is connected to a second input terminal of the corresponding EXOR logic circuit 144.

By describing for the sake of brevity the sole base circuit 140 that receives the signal PWM, the respective delay circuit 142 generates a replica signal PWM', which is equal to the signal PWM, but is delayed by a delay Δt (for example, of the order of nanoseconds). Consequently, the EXOR logic circuit 144 receives the signal PWM and the replica signal PWM' at the input and generates a pulsed signal pPWM (not shown in detail) which includes a pulse having a duration equal to the delay Δt for each edge (both rising and falling edge) of the signal PWM. The same considerations apply to the base circuits 140 that respectively receive the signal DCM, the signal OV and the signal REG_MODE; in FIG. 4, the signals generated by these base circuits 140 are indicated by DCM' and pDCM, OV' and pOV, REG_MOD' and pREG_MOD.

Figure 5:
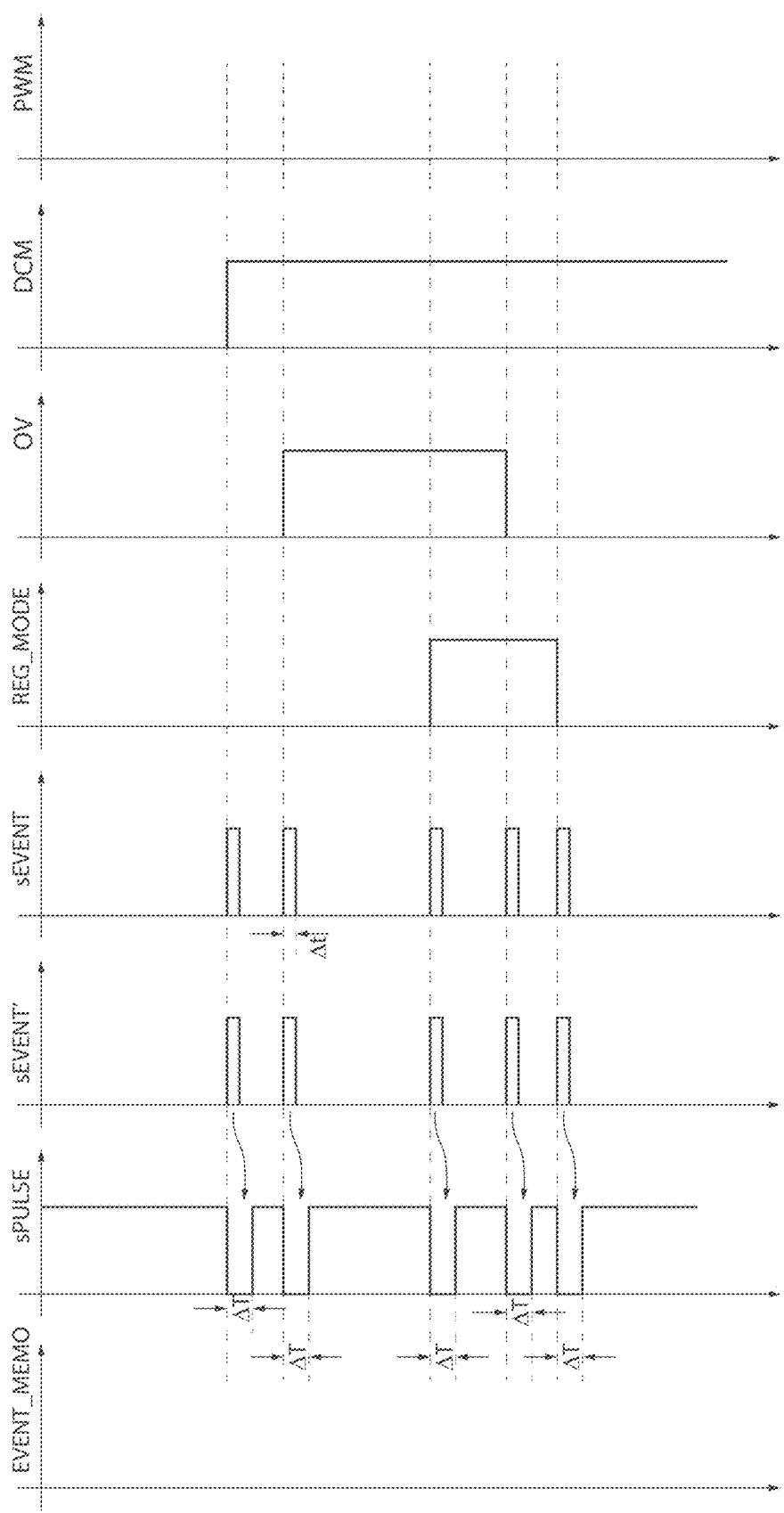
FIGS. 5, 6, 8, 10 and 11A-11B show trends over time of electrical signals, in accordance with one or more embodiments.

The event detector stage 130 further comprises an OR logic circuit 146, which receives the signals pPWM, pDCM, pOV and pREG_MOD at the input, on the basis of which it generates the signal sEVENT, which has a pulse for each edge (rising or falling edge) of any signal of the signal PWM, the signal DCM, the signal OV and the signal REG_MODE, as shown in FIG. 5; the pulses of the signal sEVENT have a duration equal to the delay Δt.

The event detector stage 130 further comprises an AND logic circuit 148, which has a first input connected to the output of the OR logic circuit 146, so as to receive the signal sEVENT, and a second input which forms the input of the event detector stage 130 that is connected to the output of the pulse generator circuit 132, so as to receive the signal sPULSE. The output of the AND logic circuit 148 forms the output of the event detector stage 130, whereon a signal sEVENT' is present, which is the result of the execution of a logic AND operation on the signals sEVENT and sPULSE, as described in greater detail below. In this regard, it is anticipated that the signal sPULSE, an example of which is shown in FIG. 5, comprises pulses wherein it is equal to '0', each of these pulses having a same duration ΔT, which is assumed to be fixed, and hereinafter referred to as the dead time ΔT. Consequently, the signal sEVENT' is equal to '0' during each pulse of the signal sPULSE; on the other hand, when the signal sPULSE is equal to '1', the signal sEVENT' is equal to the signal sEVENT.

Figure 3:
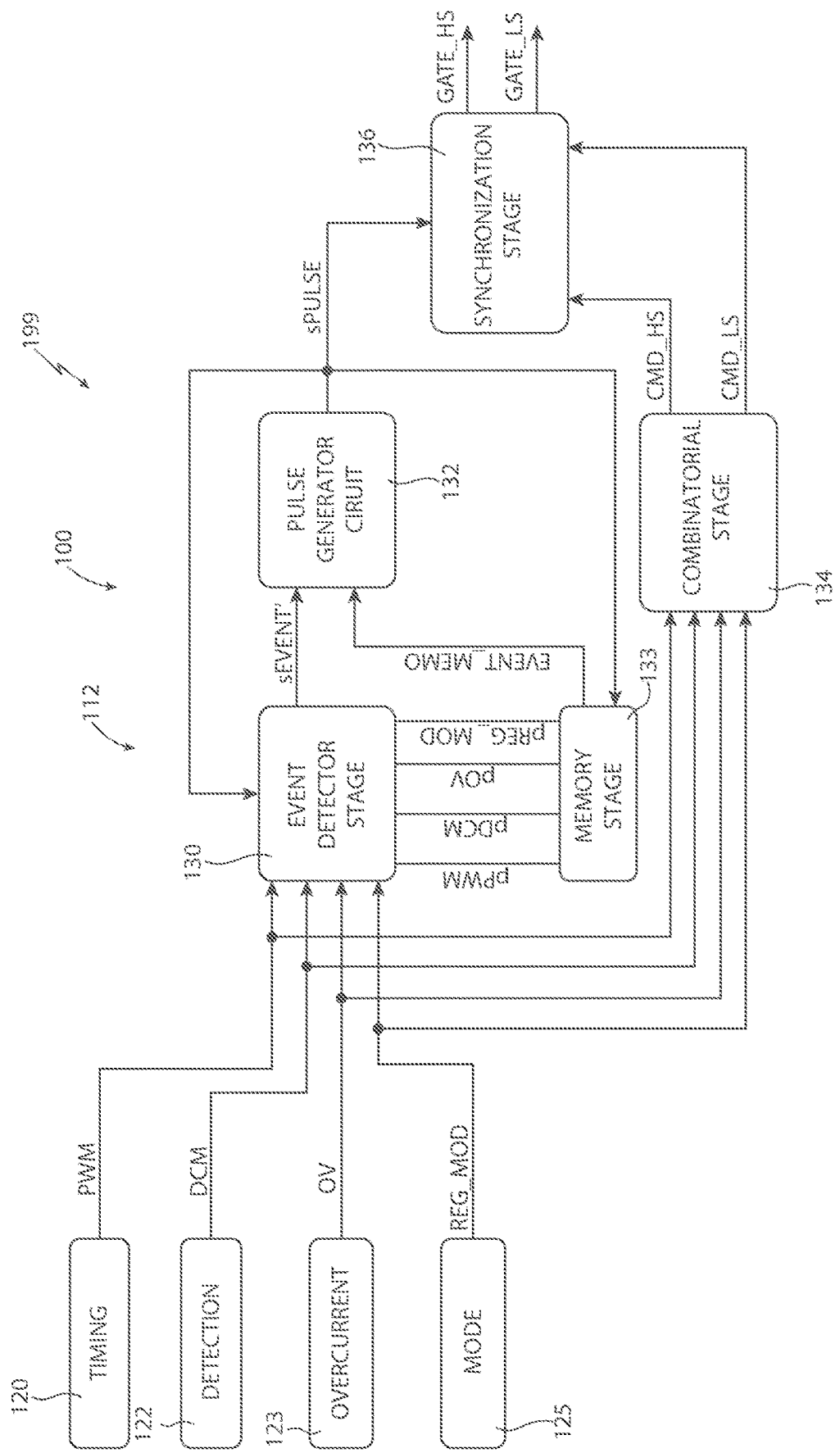
FIG. 3 shows a block diagram of a controller, in accordance with one or more embodiments of the present disclosure.

Again with reference to FIG. 4, the memory stage 133 has four inputs connected to the event detector stage 130, as also shown in FIG. 3, as well as a further input, which is connected to the output of the pulse generator circuit 132, so as to receive the signal sPULSE.

In greater detail, the memory stage 133 comprises four flip-flops 150, whose clock inputs form the aforementioned four inputs of the memory stage 133, and a logic inverter 152, whose input forms the aforementioned further input of the memory stage 133. Furthermore, the memory stage 133 comprises a respective OR logic circuit 154.

As shown in FIG. 4, the data inputs (indicated by D) of the flip-flops 150 are set at a reference voltage $V_{DD}$, which may be obtained in a per se known manner, for example from the supply voltage $V_{in}$, and represents the logic state '1'.

The clock input (indicated by ck) of each flip-flop 150 is connected to the output of a corresponding EXOR logic circuit 144 of the event detector stage 130. Consequently, the signals pPWM, pDCM, pOV and pREG_MODE are respectively present on the clock inputs of the four flip-flops 150. The outputs (indicated by Q) of the four flip-flops 150 are connected to the inputs of the OR logic circuit 154. The reset inputs (indicated by R) of the four flip-flops 150 are connected to the output of the logic inverter 152, having a signal sPULSE_N equal to the logical negation of the signal sPULSE present thereon.

In greater detail, the flip-flops 150 have a negative reset, i.e. they remain reset (so they set their outputs equal to '0') as long as the logic state '0' is present on the respective reset inputs. Furthermore, the flip-flops 150 are configured to sample the respective data inputs on the rising edges of the signals present on the respective clock inputs.

In practice, when the signal sPULSE goes from '1' to '0', and thus the signal sPULSE_N goes from '0' to '1', the flip-flops 150 are enabled (i.e., the reset is ended); subsequently, as long as the condition sPULSE='0' maintains, therefore for a time equal to the dead time ΔT, each flip-flop 150 switches its output from '0' to '1', if a rising edge of the signal present on the respective clock input occurs.

In other words, the transition from '1' to '0' of the signal sPULSE enables each flip-flop 150 to switch its output from '0' to '1', on the first occasion wherein a rising edge of the signal present on the respective clock input (the signal pPWM or the signal pDCM or the signal pOV or the signal pREG_MODE, depending on the considered flip-flop 150) occurs. For example, referring to the flip-flop 150 which receives the signal pPWM, following the transition from '1' to '0' of the signal sPULSE, it switches its output from '0' to '1' in case it occurs, before the signal sPULSE returns to '1', a pulse of the signal pPWM, which in turn occurs, as previously explained, in case a rising or falling edge of the signal PWM occurs.

Therefore, a signal sMEM, which, during each pulse of the signal sPULSE, is initially equal to '0' and subsequently assumes the logic state '1' in case, during the pulse of the signal sPULSE, a rising or falling edge of any of the signals PWM, DCM, OV and REG_MODE occurs, is present on the output of the OR logic circuit 154. Regardless of whether the aforementioned rising or falling edge of any of the signals PWM, DCM, OV and REG_MODE occurs, sMEM='0' occurs at the end of each pulse of the signal sPULSE. Consequently, for each pulse of the signal sPULSE, the signal sMEM has, in case during this pulse at least one rising or falling edge of any of the signals PWM, DCM, OV and REG_MODE occurs, a respective pulse, whose falling edge temporally coincides (as a first approximation, i.e. neglecting the propagation times) with the rising edge of the pulse of the signal sPULSE, as shown by way of example in FIG. 6, wherein the time instant in which the aforementioned rising or falling edge (not shown) occurs is indicated by $t_x$. In this regard, although in FIG. 6 two pulses of the signal sPULSE are visible, in describing the same FIG. 6 reference is made to the first of them, unless where otherwise specified.

The memory stage 133 also comprises a respective delay circuit 156, whose input is connected to the output of the OR logic circuit 154, so as to receive the signal sMEM. The delay circuit 156 generates a signal MEMO_MASK, which is equal to the signal sMEM, except for a delay δ, which for example may be equal to the delay Δt. Therefore, the signal MEMO_MASK comprises a respective pulse for each pulse of the signal sMEM, as shown for example again in FIG. 6; as a first approximation, the falling edge of the pulse of the signal MEMO_MASK is delayed, with respect to the rising edge of the pulse of the signal sPULSE, by the delay Δt.

The memory stage 133 further comprises a respective AND logic circuit 158, which has a first input connected to the output of the delay circuit 156, so as to receive the signal MEMO_MASK, and a second input which is connected to the input of the logic inverter 152, so as to receive the signal sPULSE. The output of the AND logic circuit 158 forms the output of the memory stage 133.

In greater detail, the AND logic circuit 158 generates a signal EVENT_MEMO, which is the result of the application of a logic AND operation to the signals MEMO_MASK and sPULSE. Consequently, during each pulse of the signal sPULSE, the signal EVENT_MEMO is equal to '0'. Furthermore, at the end of each pulse of the signal sPULSE, i.e. after the signal sPULSE has returned to '1', the signal EVENT_MEMO has a corresponding pulse, if during the preceding pulse of the signal sPULSE a rising edge of the signal sMEM has occurred; as a first approximation, this pulse of the signal EVENT_MEMO has a duration equal to the delay Δt and extends from the end of the pulse of the signal sPULSE.

Figure 7:
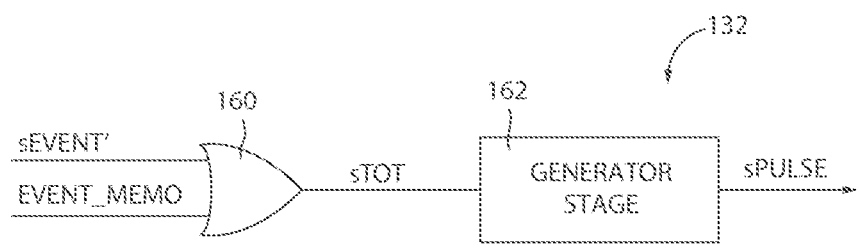

As shown in FIG. 7, the pulse generator circuit 132 comprises a respective OR logic circuit 160, whose inputs form the inputs of the pulse generator circuit 132 and are respectively connected to the outputs of the event detector stage 130 and of the memory stage 133, so as to receive respectively the signal sEVENT' and the signal EVENT_MEMO. The OR logic circuit 160 generates on its output a signal sTOT, which is the result of the application of a logic OR operation to the signals sEVENT' and EVENT_MEMO and therefore has pulses which, as a first approximation, are temporally coincident with the pulses of the signals sEVENT' and EVENT_MEMO.

Furthermore, the pulse generator circuit 132 comprises a generator stage 162, which has an input connected to the output of the OR logic circuit 160 and an output which forms the output of the pulse generator circuit 132. The generator stage 162 generates on its output the signal sPULSE, as a function of the signal sTOT, as described hereinbelow, initially assuming that no rising or falling edge has yet occurred in any of the signals PWM, DCM, OV and REG_MODE, in which case the signal sPULSE is equal to '1', while the signals sEVENT' and EVENT_MEMO are equal to '0'.

Following the occurrence of a rising or falling edge of any of the signals PWM, DCM, OV and REG_MODE (hereinafter referred to as the first asynchronous edge), a first pulse of the signal sEVENT' is generated, therefore a first pulse of the signal sTOT is also generated. In response to the reception of the first pulse of the signal sTOT, the generator stage 162 generates a pulse of the signal sPULSE, which is hereinafter referred to as the first pulse of the signal sPULSE, i.e. it sets the signal sPULSE equal to '0' for a time interval equal to the dead time ΔT. As a first approximation, the falling edge of the first pulse of the signal sPULSE temporally coincides with the rising edge of the first pulse of the signal sEVENT', which in turn temporally coincides with said first asynchronous edge, as shown for example in FIG. 5.

Since the signal sPULSE has been set equal to '0', the signal sEVENT' is in turn set to '0'; consequently, even in case, during said first pulse of the signal sPULSE, a further rising or falling edge of any of the signals PWM, DCM, OV and REG_MODE (hereinafter referred to as the second asynchronous edge) occurs, this would not entail the generation of any second pulse of the signal sEVENT'. In other words, during the first pulse of the signal sPULSE, the generation mechanism of the pulses of the signal sEVENT' in response to the occurrence of edges of the signals PWM, DCM, OV and REG_MODE is inhibited; the event detector stage 130 is therefore temporarily insensitive.

Furthermore, during the first pulse of the signal sPULSE, the flip-flops 150 of the memory stage 133 are enabled. In case, during the first pulse of the signal sPULSE, the aforementioned second asynchronous edge does not occur, the signal EVENT_MEMO remains equal to '0' both during the first pulse of the signal sPULSE and subsequently at the end of the first pulse of the signal sPULSE. For example, this situation occurs in FIG. 5, wherein five pulses of the signal sPULSE are shown; during each of these pulses of the signal sPULSE, no edge of the signals PWM, DCM, OV and REG_MODE occurs.

Conversely, in case, during the first pulse of the signal sPULSE, at least the aforementioned second asynchronous edge occurs (the occurrence of any further subsequent asynchronous edges would in any case not modify the following description), once the first pulse of the signal sPULSE has ended a pulse of the signal EVENT_MEMO is generated, and therefore a second pulse of the signal sTOT is generated.

In response to the reception of the second pulse of the signal sTOT, the generator stage 162 generates a new pulse of the signal sPULSE, hereinafter referred to as the second pulse of the signal sPULSE. This situation occurs for example in FIG. 6.

Figure 6:
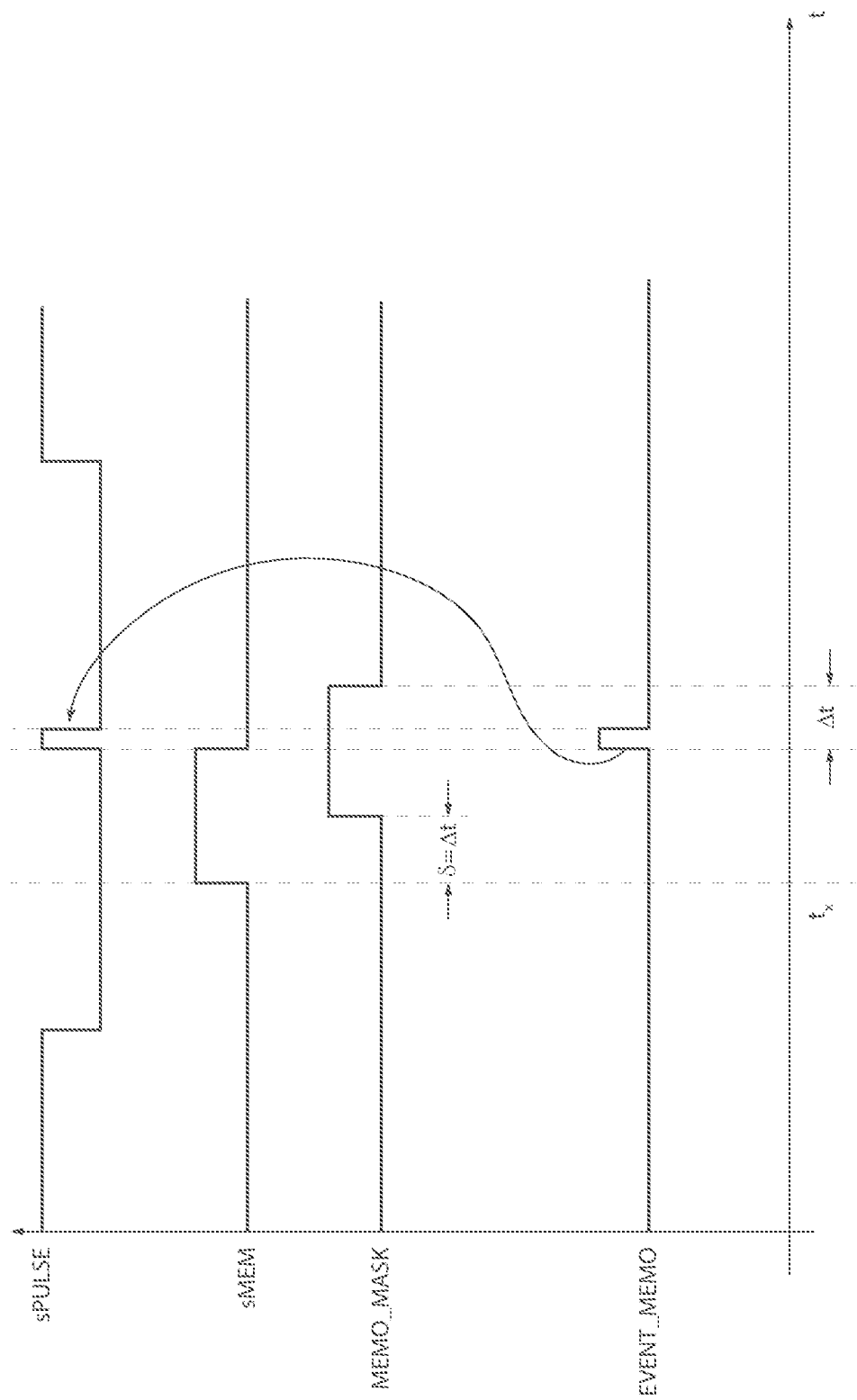

In particular, FIG. 6 shows how the falling edge of the second pulse of the signal sPULSE is slightly delayed with respect to the rising edge of the signal EVENT_MEMO, the extent of this delay being negligible; however, this allows the signal sPULSE to return to '1' between the first and the second pulses, so as to reset again the flip-flops 150 of the memory stage 133. In practice, the first and the second pulses of the signal sPULSE are separated by a negligible time. Furthermore, considering the reduced time that elapses between the first and the second pulses of the signal sPULSE, it is for example possible to size the control module 100, and in particular the propagation times of the signals therein, so that, in case a third asynchronous edge occurs between the first and the second pulses of the signal sPULSE, (for example) no variation of the signal sPULSE occurs with respect to what has been shown in FIG. 6 or, again by way of example, so that the falling edge of the second pulse of the signal PULSE is caused by this third asynchronous edge, therefore is anticipated with respect to what has been shown in FIG. 6; in any case, the management of any asynchronous edges occurring between the first and the second pulses of the signal sPULSE is irrelevant for the purposes of the operation of the present control module.

Figure 8:
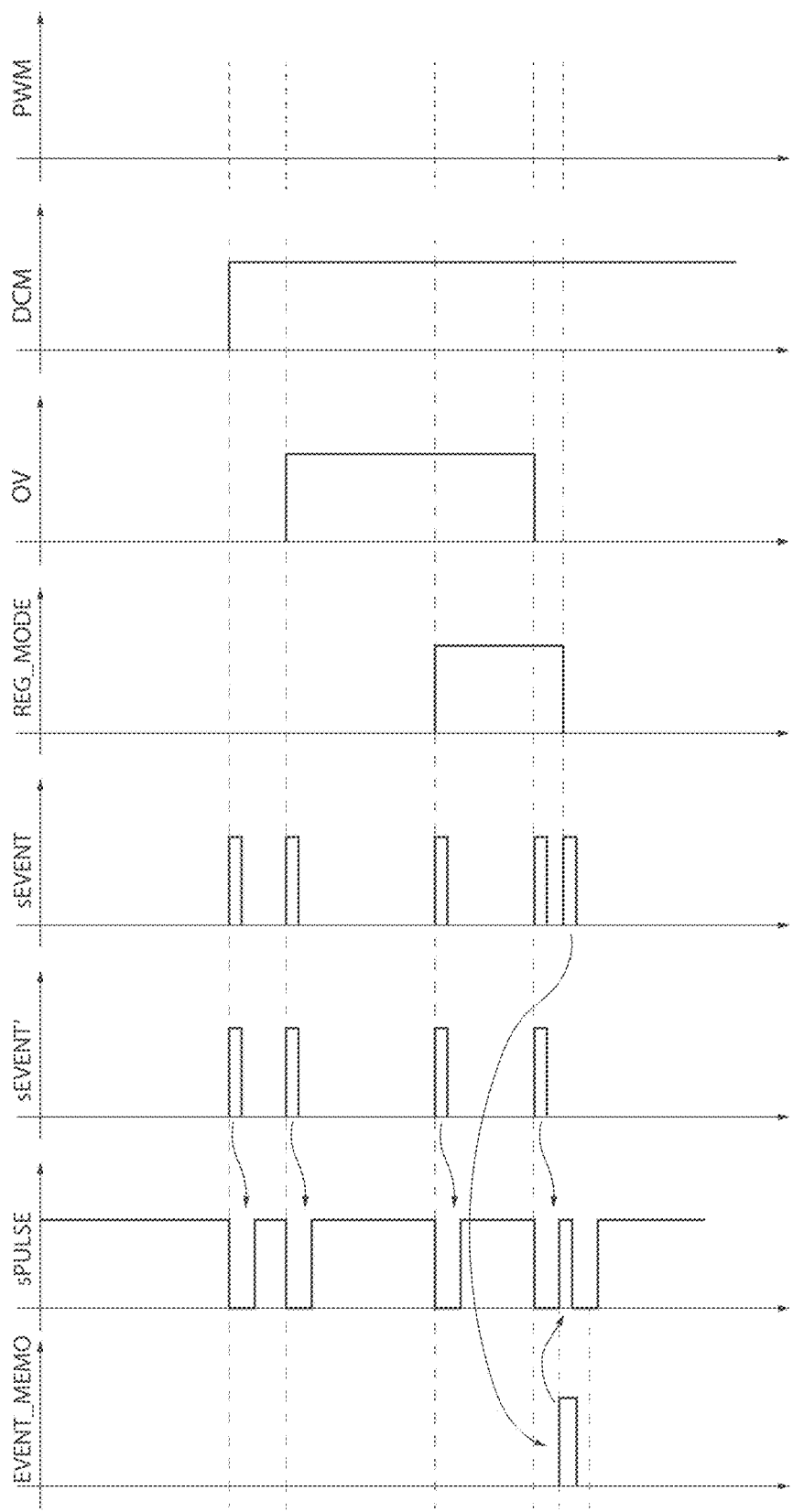

On the other hand, FIG. 8 shows an example wherein four pulses of the signal sPULSE are present, the fourth pulse of the signal sPULSE being caused by a falling edge of the signal OV; furthermore, similarly to what has been shown in FIG. 6, during the fourth pulse of the signal sPULSE, a falling edge of the signal REG_MODE occurs, which causes the generation of a corresponding pulse of the signal EVENT_MEMO, subsequently at the end of the fourth pulse of the signal sPULSE, this pulse of the signal EVENT_MEMO causing the generation, by the generator stage 162, of a fifth pulse of the signal sPULSE.

In practice, the memory stage 133 allows storing, for each pulse of the signal sPULSE, the occurrence of at least one asynchronous edge during the pulse of the signal sPULSE, so as to cause the generation of a subsequent pulse of the signal sPULSE, caused precisely by this asynchronous edge, for reasons that will be explained below. This storage occurs both during the pulses of the signal sPULSE caused by pulses of the signal sEVENT', and during the pulses of the signal sPULSE caused by pulses of the signal EVENT_MEMO, owing to that the latter are also preceded by time intervals wherein the signal sPULSE is equal to '1', as shown in FIG. 6, with resulting reset of the flip-flops 150 of the storage stage 133.

As shown in FIG. 3, the control module 100 further comprises a synchronization stage 136, which has inputs connected to the outputs of the combinatorial stage 134 and of the pulse generator circuit 132.

In detail, the combinatorial stage 134 is configured to generate the signals CMD_HS and CMD_LS, in a per se known manner and as a function of the signals PWM, DCM, OV and REG_MODE. In practice, in this example, the combinatorial stage 134 maps the sixteen possible values of the quadruplets of input bits formed by the logic states of the signals PWM, DCM, OV and REG_MODE on four possible pairs of output bits, formed by the logic states of the signals CMD_HS and CMD_LS. The combinatorial stage 134 then implements a respective truth table.

The synchronization stage 136 is configured to generate the signals GATE_HS and GATE_LS, as a function of the signals CMD_HS and CMD_LS and the signal sPULSE.

Figure 9:
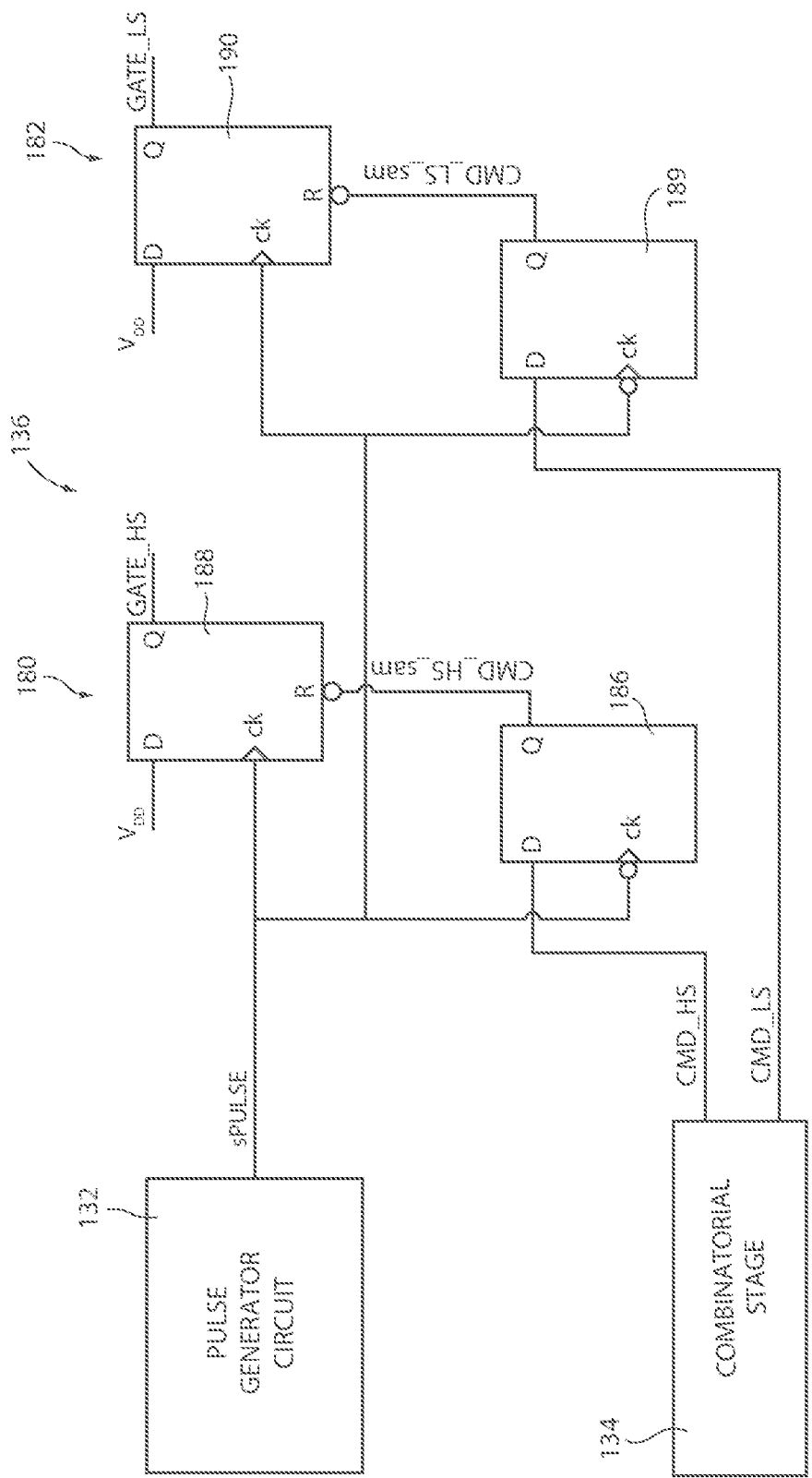

In greater detail, as shown in FIG. 9, the synchronization stage 136 comprises a first and a second synchronization circuit 180, 182, equal to each other.

The first synchronization circuit 180 comprises an input flip-flop 186 and an output flip-flop 188. The input and output flip-flops of the second synchronization circuit 182 are indicated respectively by 189 and 190.

In general, the input flip-flops 186 and 189 have no reset, while the output flip-flops 188, 190 have respective reset inputs and operate with negative reset, i.e. they are reset when the logic state '0' occurs on the respective reset inputs. Furthermore, the clock inputs of the input flip-flops 186, 189 and of the output flip-flops 188, 190 are connected to the output of the pulse generator circuit 132, so as to receive the signal sPULSE; the input flip-flops 186, 189 are configured to operate on the falling edges of the signal sPULSE, while the output flip-flops 188, 190 are configured to operate on the rising edges of the signal sPULSE. The data inputs of the output flip-flops 188, 190 are set at the reference voltage $V_{DD}$, i.e. the logic state '1'.

As regards the first synchronization circuit 180, the data input of the input flip-flop 186 is connected to the combinatorial stage 134 so as to receive the signal CMD_HS; furthermore, the output of the input flip-flop 186 is connected to the reset input of the output flip-flop 188.

As regards the second synchronization circuit 182, the data input of the input flip-flop 189 is connected to the combinatorial stage 134 so as to receive the signal CMD_LS; furthermore, the output of the input flip-flop 189 is connected to the reset input of the output flip-flop 190.

For reasons that will be clarified below, the first logic control signal GATE_HS and the second logic control signal GATE_LS are respectively generated on the outputs of the output flip-flops 188, 190 of the first and the second synchronization circuits 180, 182, and then they are provided at input to the top and, respectively, to the bottom driving stages 16, 18 (not shown in FIG. 3, wherein the converter is indicated as a whole by 199). In FIG. 3 the top transistor 2, the bottom transistor 4, the inductor L, the output capacitor $C_{out}$ and the load 15 are also not shown.

Figure 10:
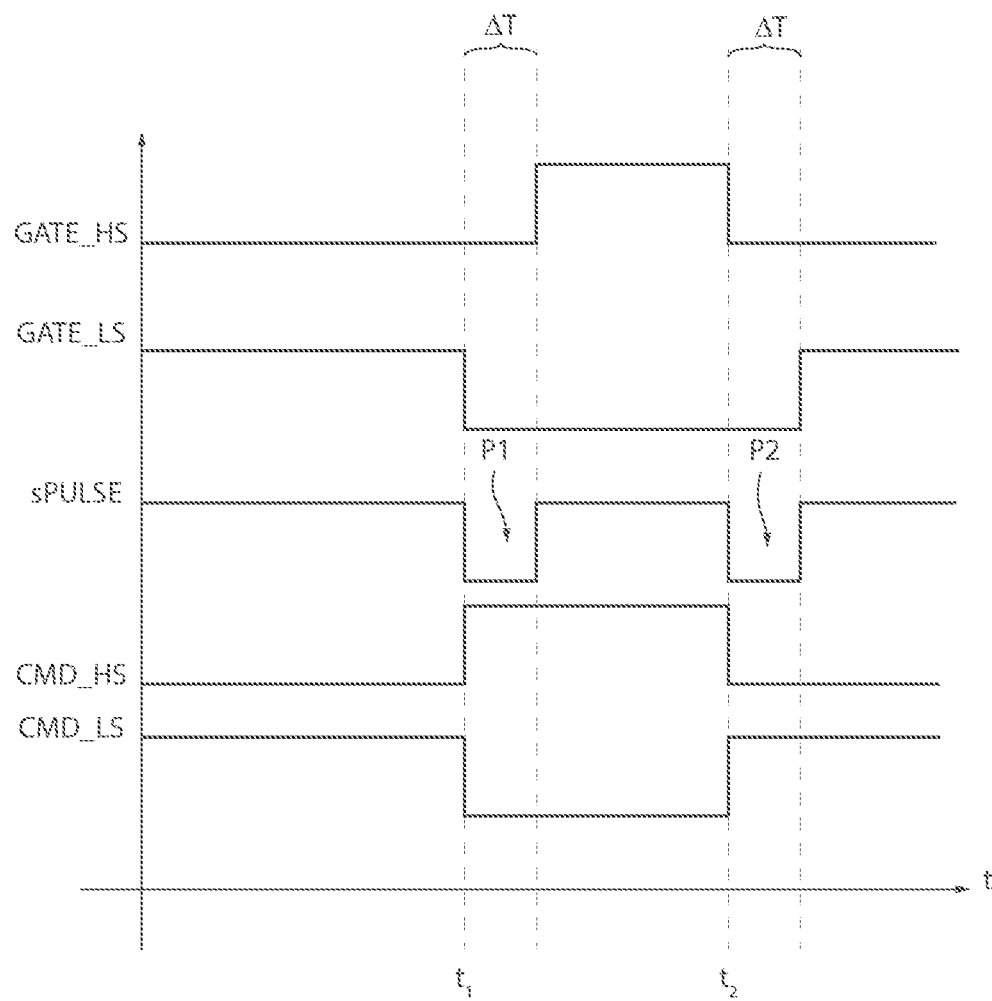

In greater detail, the relationship between the first logic control signal GATE_HS and the second logic control signal GATE_LS and the signal sPULSE is shown in FIG. 10. By way of example, FIG. 10 shows a time instant t1 wherein an edge (not shown) of any of the signals PWM, DCM, OV and REG_MODE occurs, resulting in the generation of a pulse of the signal sEVENT' (not shown) and therefore of a corresponding pulse (indicated by P1) of the signal sPULSE; furthermore, FIG. 10 shows a time instant $t_2$, subsequent to the pulse P1, wherein a further edge (not shown) of any of the signals PWM, DCM, OV and REG_MODE occurs, resulting in the generation of a further pulse of the signal sEVENT' (not shown) and therefore of a corresponding pulse (indicated by P2) of the signal sPULSE. Furthermore, FIG. 10 assumes that, due to the aforementioned edge occurring at the time instant $t_1$, the combinatorial stage 134 switches the signal CMD_HS from '0' to '1' and switches the signal CMD_LS from '1' to '0'; at the time instant $t_2$, the combinatorial stage 134 switches the signal CMD_HS from '1' to '0' and switches the signal CMD_LS from '0' to '1'.

Consequently, referring for example to the first synchronization circuit 180, the following occurs. On the falling edge of the pulse P1, the output flip-flop 188 remains inactive, i.e. it does not sample the data item present on its data input; consequently, the first logic control signal GATE_HS remains temporarily unchanged and equal to '0'. On the other hand, on the falling edge of the pulse P1, the input flip-flop 186 carries out a sampling of the data item present on its data input, which is precisely equal to '1' (to better understand this statement, observe how, strictly speaking, the falling edge of the pulse P1 occurs with a however minimum delay with respect to the time instant $t_1$), therefore this causes the removal of the reset of the output flip-flop 188. At the subsequent rising edge of the pulse P1, the input flip-flop 186 remains inactive, while the output flip-flop 188 carries out a respective sampling, therefore the first logic control signal GATE_HS switches to '1', with a delay with respect to the time instant t1 equal to the dead time $\Delta T$.

Referring to the second synchronization circuit 182, the following occurs. On the falling edge of the pulse P1, the output flip-flop 190 remains inactive, i.e. it does not sample the data item present on its data input. On the other hand, on the falling edge of the pulse P1, the input flip-flop 189 carries out a sampling of the data item present on its data input, which is equal to '0', therefore this causes the activation of the reset of the output flip-flop 190. Consequently, the second logic control signal GATE_LS switches to '0', as a first approximation without any delay with respect to the time instant $t_1$. At the subsequent rising edge of the pulse P1, the input flip-flop 189 remains inactive, therefore the output flip-flop 190 does not carry out the respective sampling, as it is still subject to reset.

At the time instant $t_2$, the behavior of the first and the second synchronization circuits 180, 182 is inverted with respect to what has been described with reference to the time instant $t_1$. Consequently, the first logic control signal GATE_HS switches to '0' approximately without any delay with respect to the time instant $t_2$, while the second logic control signal GATE_LS switches to '1' with a delay with respect to the time instant $t_2$ equal to the dead time $\Delta T$.

In practice, indicating with CMD_HS_sam and CMD_LS_sam the signals present respectively on the outputs of the input flip-flops 186, 189, they represent signals obtained by sampling, on each falling edge of the signal sPULSE, the signals CMD_HS and CMD_LS. The values of the signals CMD_HS_sam and CMD_LS_sam are updated at each falling edge of the signal sPULSE and meet the truth table of the combinatorial stage 134, when calculated on the basis of the values assumed by the signals present at the input of the combinatorial stage 134 at the falling edge of the signal sPULSE.

The output flip-flops 188, 190 form an update stage, which at each pulse of the signal sPULSE updates the values of the first and the second logic control signals GATE_HS, GATE_LS, respectively as a function of the signals CMD_HS_sam and CMD_LS_sam. Owing to the reset action, the update occurs following the falling edge of the signal sPULSE, in case the signal CMD_HS_sam/CMD_LS_sam switches from '1' to '0', while it occurs following the rising edge of the signal sPULSE, if the signal CMD_HS_sam/CMD_LS_sam switches from '0' to '1'. Furthermore, in case the values of the signal CMD_HS and/or the signal CMD_LS have not changed with respect to the preceding sampling (and this depends on the truth table implemented by the combinatorial stage 134), the synchronization stage 136 does not cause any state switching of the first and/or the second logic control signal GATE_HS, GATE_LS.

In other words, at each pulse of the signal sPULSE, the synchronization stage 136 samples the values of the signal CMD_HS and the signal CMD_LS and updates the values of the first and the second logic control signals GATE_HS, GATE_LS, so that the first and the second logic control signal GATE_HS, GATE_LS are replicas, respectively, of the signal CMD_HS and CMD_LS, but with rising edges that are delayed by a delay equal to the dead time $\Delta T$ with respect to the corresponding rising edges of the signals CMD_HS and CMD_LS and with falling edges that, as a first approximation, are temporally coincident with the corresponding falling edges of the signals CMD_HS and CMD_LS.

In the preceding description, for the sake of simplicity, it has been assumed that no asynchronous edge occurred during each of the pulses P1 and P2 of the signal sPULSE; in other words, it has been assumed that the pulses P1 and P2 have been caused by corresponding pulses of the signal sEVENT' and that the signal EVENT_MEMO has always remained equal to '0'. However, to appreciate the usefulness of the memory stage 133 reference may be made to FIGS. 11A and 11B, wherein, for simplicity of display, the pulses of the signal sEVENT are indicated as pulses of infinitesimal duration.

Figure 11A:
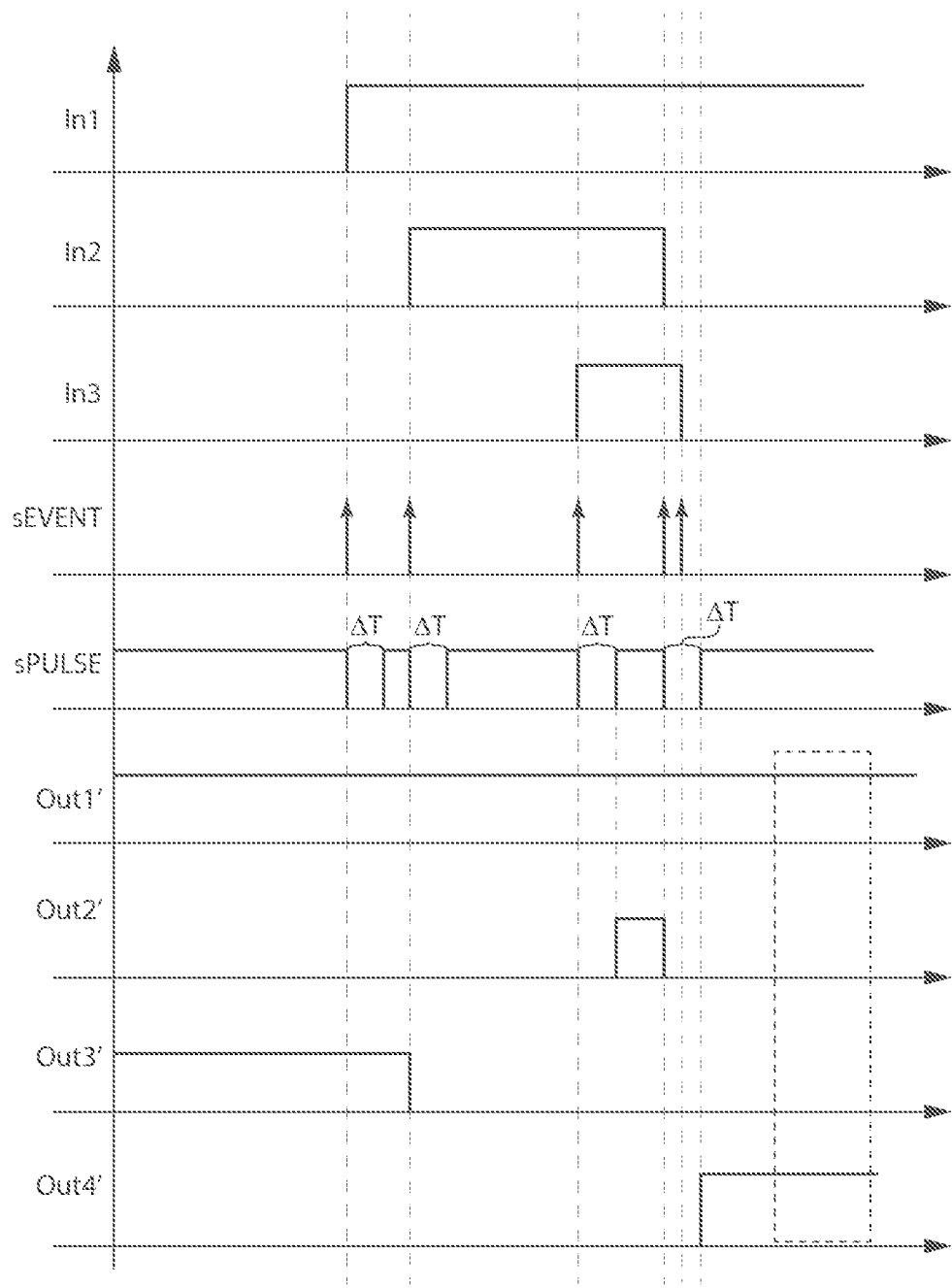
Figure 11B:
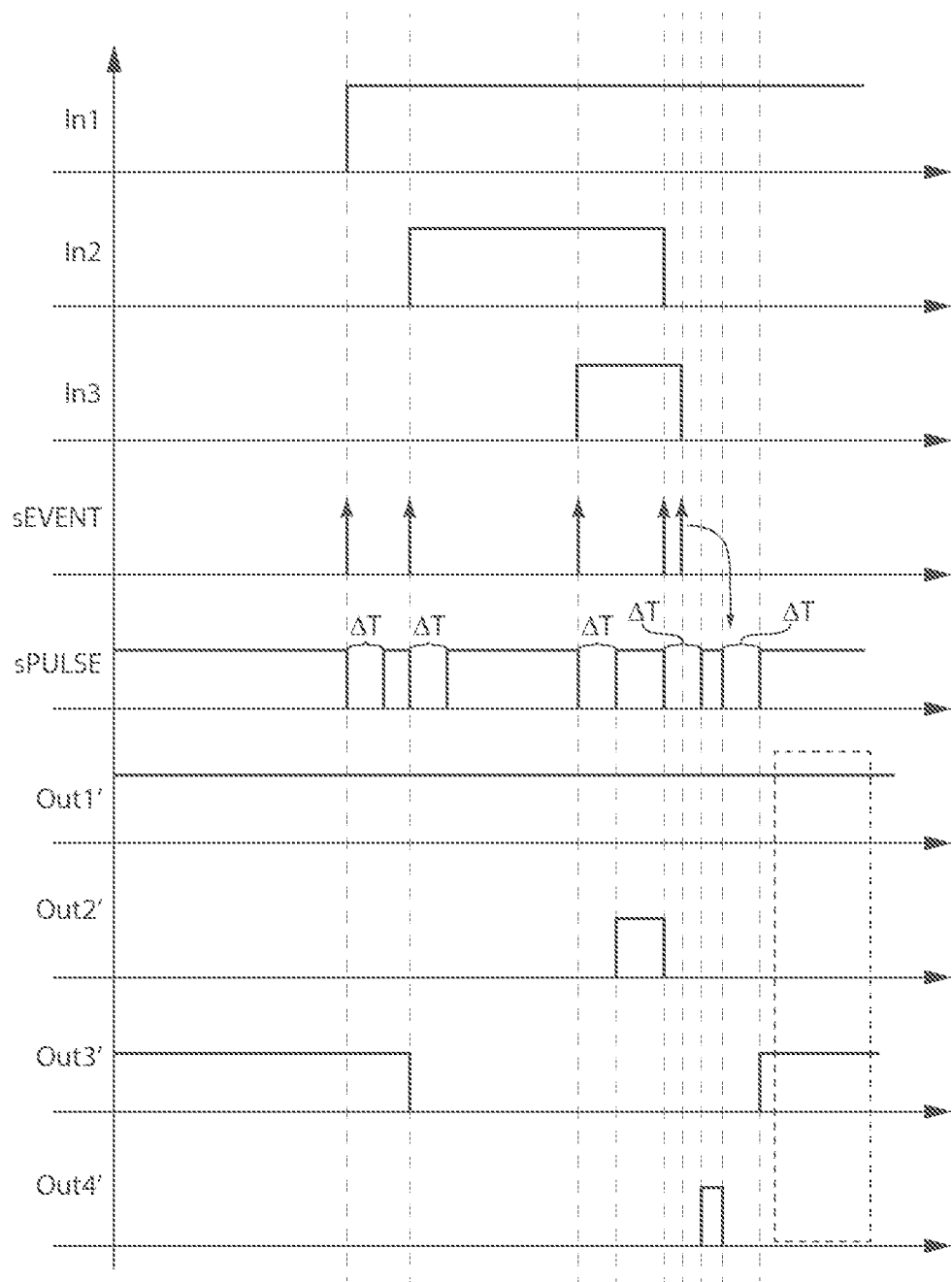

In detail, purely by way of example, FIGS. 11A and 11B refer to an embodiment (not shown) wherein the control module 100 forms, for example, a buck-boost converter (not shown) or in any case a converter (not shown) which includes more than two switches.

In greater detail, and without any loss of generality, FIGS. 11A-11B refer to a case wherein the event detector stage 130 and the combinatorial stage 134 are connected to circuits which generate signals indicated respectively by In1, In2 and In3, each of which may coincide for example with a corresponding signal among the aforementioned signals PWM, DCM, OV and REG_MODE or may be another signal of a per se known type. Furthermore, it is assumed that the combinatorial stage 134 generates four signals, indicated by Out1, Out2, Out3 and Out4, on the basis of the signals In1, In2 and In3 and of the truth table shown in FIG. 12; in addition, it is assumed that the synchronization stage 136 includes four synchronization circuits (not shown) and generates four signals Out1', Out2', Out3' and Out4', on the basis of the signal sPULSE and, respectively, of the signals Out1, Out2, Out3 and Out4, in the same manner as described with reference to FIGS. 9 and 10. For example, the signals Out1', Out2', Out3', Out4' may be provided respectively to the top driving stage 16, to the bottom driving stage 18 and to two further driving stages (not shown), the latter being configured to drive two further transistors (not shown), which form, together with the top transistor 2 and the bottom transistor 4, the aforementioned converter with more than two switches.

This having been said, FIG. 11A shows five pulses of the signal sEVENT; considering the first, the second, the third and the fourth pulses of the signal sEVENT, it occurs that pairs of adjacent pulses are temporally distant from each other by a longer time than the dead time $\Delta T$, therefore a corresponding pulse of the signal sPULSE corresponds to each of the first, the second, the third and the fourth pulses of the signal sEVENT. Conversely, the fifth pulse of the signal sEVENT is distant from the fourth pulse of the signal sEVENT by a shorter time than the dead time ΔT. Consequently, in the absence of the memory stage 133, the following would occur.

In detail, referring to the input vector, the combinatorial output vector and the synchronized output vector to indicate respectively (In1, In2, In3), (Out1, Out2, Out3, Out4) and (Out1', Out2', Out3', Out4'), the fourth pulse of the signal sPULSE is due to the transition of the input vector from (1,1,1), which corresponds to the combinatorial output vector (1,1,0,0), to (1,0,1), which corresponds to the combinatorial output vector (1,0,0,1); as previously explained, the synchronization stage causes signal Out2' to switch from '1' to '0' (as a first approximation) when the switching from '1' to '0' of the signal In2 occurs, while the signal Out4' switches from '0' to '1' with a delay approximately equal to the dead time ΔT with respect to the switching from '1' to '0' of the signal In2. Consequently, the synchronized output vector becomes equal to (1,0,0,1) with a delay equal to the dead time ΔT with respect to the switching from '1' to '0' of the signal In2.

The fifth pulse of the signal sEVENT is due to the transition of the input vector from (1,0,1), which as said corresponds to the combinatorial output vector (1,0,0,1), to (1,0,0), which corresponds to the combinatorial output vector (1,0,1,0). However, since the switching from '1' to '0' of the signal In3 occurs during the fourth pulse of the signal sPULSE, in the absence of the memory stage 133 the switching from '1' to '0' of the signal In3 would not cause any corresponding pulse of the signal sPULSE and therefore would have no effect on the synchronized output vector, which would remain equal to (1,0,0,1) (see the dashed region in FIG. 11A). This might entail a temporary incorrect operation of the converter, in particular up to the occurrence of a subsequent pulse of the signal sPULSE, which would cause the synchronized output vector to be updated.

Conversely, in the presence of the memory stage 133, what has been shown in FIG. 11B occurs.

In detail, the switching from '1' to '0' of the signal In3 that occurs during the fourth pulse of the signal sPULSE causes the subsequent generation of a fifth pulse of the signal sPULSE (the time distance of the fifth pulse with respect to the fourth pulse is increased in FIG. 11B, to facilitate the viewing).

Consequently, the fifth pulse of the signal sPULSE causes a new actuation of the synchronization stage 136, which then updates the values of the synchronized output vector (Out1', Out2', Out3', Out4'); in fact, in the dashed region in FIG. 11B it is noted how, as a first approximation, the signal Out4' switches from '1' to '0' at the falling edge of the fifth pulse of the signal sPULSE, while the signal Out3' goes from '0' to '1' at the rising edge of the fifth pulse, therefore with a delay equal to the dead time ΔT with respect to the falling edge of the fifth pulse of the signal sPULSE. Consequently, subsequently to the rising edge of the fifth pulse of the signal sPULSE, the synchronized output vector is correctly equal to (1, 0, 1, 0).

In general, even in the case (not shown in FIG. 11B) wherein further pulses of the signal sEVENT occur, in addition to the fifth pulse of the signal sEVENT, during the fourth pulse of the signal sPULSE, the synchronized output vector would be corrected soon after the rising edge of the fifth pulse of the signal sPULSE, because the synchronized output vector would be updated by the synchronization stage 136 after such further pulses of the signal sEVENT have occurred, and therefore after the combinatorial stage 134 has updated the combinatorial output vector accordingly. In this regard, it is assumed that the combinatorial stage 134 as a first approximation updates the combinatorial output vector without any delay, following variations of the input vector.

Figure 13:
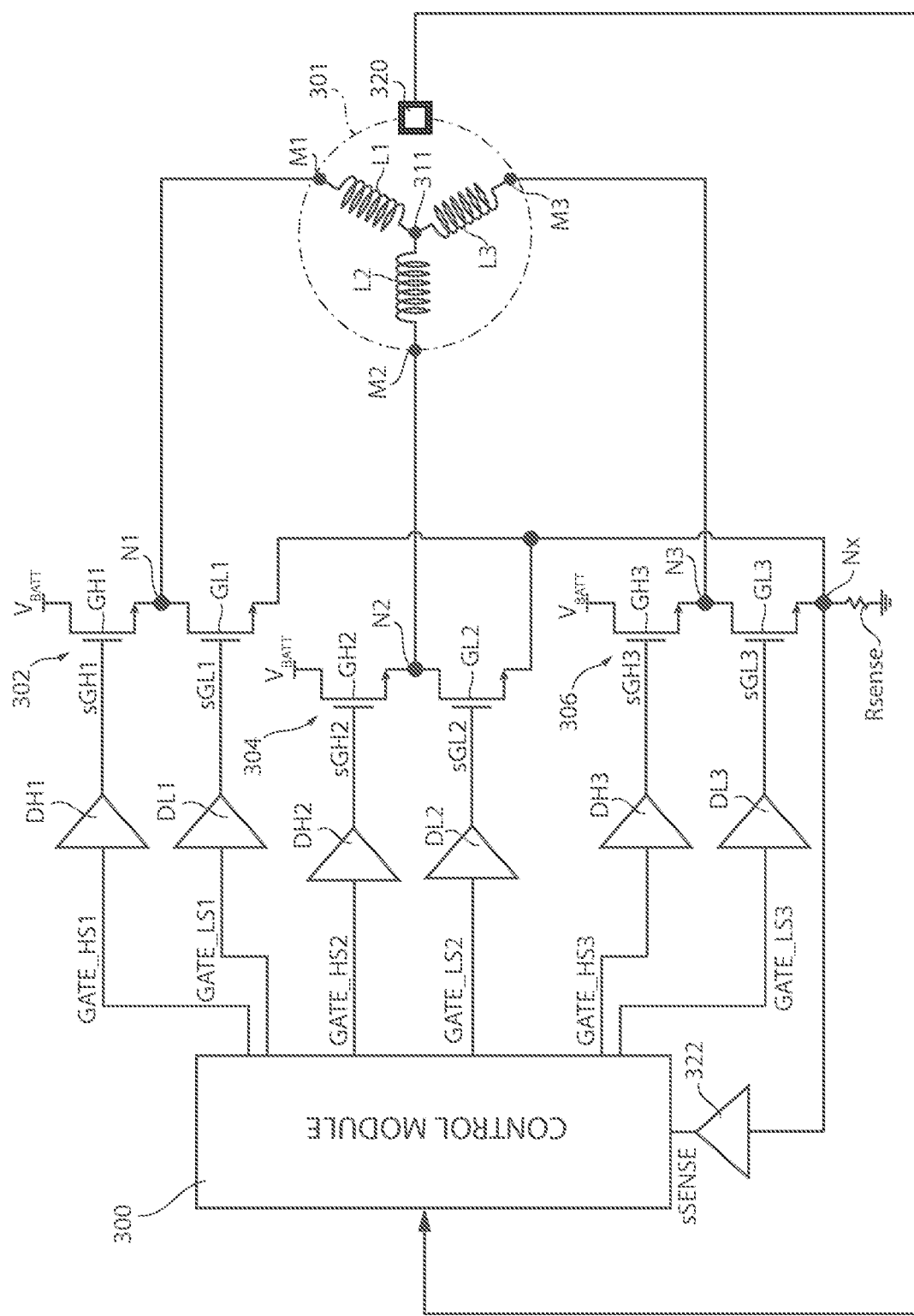
FIG. 13 shows a circuit diagram of a control system of an electric motor, in accordance with one or more embodiments.

As previously mentioned, embodiments are also possible wherein the control module controls an electronic circuit other than a converter, as illustrated for example in FIG. 13, wherein the control module (indicated by 300) forms a control circuit 299 of an electric motor 301 of the three-phase type, which has an equivalent circuit model that includes a first, a second and a third inductor L1, L2, L3, whose first terminals are indicated respectively with M1, M2, M3, and whose second terminals are connected so as to form a common node 311.

In detail, the control module 300 controls a first, a second and a third pair of driving stages, each pair comprising a respective top driving stage (indicated by DHi, with the index 'i' indicating the pair, therefore i=1,2,3) and a respective bottom driving stage (indicated by DLi, with i=1,2,3). Furthermore, the first, the second and the third pair of driving stages respectively control a first, a second and a third pair of switches 302, 304, 306, each of which comprises a respective top switch and a respective bottom transistor, indicated respectively by GHi and GLi (with i=1,2,3) and formed by corresponding NMOS transistors.

In greater detail, the first, the second and the third pair of switches 302, 304, 306 are equal to each other. For example, referring to the first pair of switches 302, the source terminal of the top transistor GH1 is connected to the drain terminal of the bottom transistor GL1, so as to form a first internal node N1, which is connected to the first terminal M1 of the first inductor L1 of the electric motor 301; the drain terminal of the top transistor GH1 is set at a battery voltage $V_{BATT}$, while the source terminal of the bottom transistor GL1 is connected to a detection node Nx, which in turn is connected to ground by a resistor $R_{sense}$. The same considerations apply to the second and the third pair of switches 304, 306, except for that the related switches are connected so as to form respectively a second and a third internal node N2, N3, which are respectively connected to the first terminals M2, M3 of the second and the third inductors L2, L3 of the electric motor 301.

In addition, still referring for example to the first pair of switches 302, the top driving stage DH1 and the bottom driving stage DL1 respectively generate a signal sGH1 and a signal sGL1, which are applied to the gate terminals of the top transistor GH1 and of the bottom transistor GL1; the signals sGH1 and sGL1 are generated respectively as a function of a signal GATE_HS1 and a signal GATE_LS1, in the same manner as described with reference to the signals SHS, SLS, GATE_HS and GATE_LS. The same considerations apply to the second pair of switches 304, which are controlled through a signal sGH2 and a signal sGL2, which are generated respectively as a function of a signal GATE_HS2 and a signal GATE_LS2. Similarly, the third pair of switches 306 is controlled through a signal sGH3 and a signal sGL3, which are generated respectively as a function of a signal GATE_HS3 and a signal GATE_LS3.

Although not shown, the combinatorial stage 134 and the event detector stage 130 of the control module 300 receive at the input a rotor position signal sROT generated by a sensor 320 and indicative of the position of the rotor of the electric motor 301, and a signal sSENSE, generated by a current amplifier 322 and indicative of the current that flows in the resistor $R_{sense}$. Furthermore, for each of the signals GATE_HS1, GATE_LS1, GATE_HS2, GATE_LS2, GATE_HS3, GATE_LS3, the combinatorial stage 134 generates a corresponding preliminary signal (not shown), on the basis of a truth table of known type, which has as inputs the rotor position signal sROT and the signal sSENSE; the synchronization stage 136 therefore generates each of the signals GATE_HS1, GATE_LS1, GATE_HS2, GATE_LS2, GATE_HS3, GATE_LS3 on the basis of a corresponding preliminary signal and of the signal sPULSE, in the same manner as described with reference to FIGS. 9 and 10.

In greater detail, referring for example to the signals GATE_HS1*, GATE_LS1*, GATE_HS2*, GATE_LS2*, GATE_HS3*, GATE_LS3* to indicate the preliminary signals generated by the combinatorial stage 134, the truth table is such that they form three pairs of signals, the signals of each pair being the logical negation of one another, the pairs being phase-shifted with each other by 120°. Considering, for example, the sole pair formed by the signals GATE_HS1* and GATE_LS1*, the synchronization stage 136 generates the signals GATE_HS1, GATE_LS1 so that they are replicas, respectively, of the signal GATE_HS1* and the signal GATE_LS1*, but delaying the rising edges by a delay equal to the dead time $\Delta T$ with respect to the corresponding rising edges of the signals GATE_HS1* and GATE_LS1* and letting the falling edges be, as a first approximation, temporally coincident with the corresponding falling edges of the signals GATE_HS1* and GATE_LS1*. Furthermore, in a per se known manner, the truth table implemented by the combinatorial stage 134 is such that, at any instant, the electric motor 301 is traversed by a current that flows in one of the top transistors GH1, GH2, GH3 and, after traversing two inductors of the first, the second and the third inductors L1, L2, L3, it traverses one of the bottom transistors GL1, GL2, GL3 and finally traverses the resistor $R_{sense}$.

Again, purely by way of example, embodiments (not shown) are also possible, wherein the present control module is used to control a so-called half-bridge circuit, which, in a per se known manner, comprises a single pair of switches connected in series.

The advantages that the present control module affords are clear from the preceding description.

In particular, the present control module allows generating signals that control the turn-on and -off of switches so as to avoid the cross-conduction, without resorting to a high-frequency timing signal, but rather generating dead time pulses as a function of asynchronous edges which are generated during the normal operation of the circuit including the switches and synchronizing the turn-off and -on of the switches respectively with the leading edge and the trailing edge of each dead time pulse. This solution benefits from that the combinatorial stage has low consumption when no state variations of the input signals (for example, during the so-called "pulse-skipping" or "low-power" operation periods, in case the switches form a switching converter) occur; furthermore, this solution benefits from shorter response times with respect to what occurs in case of adoption of (for example) a finite state machine.

Furthermore, the memory stage allows storing the occurrence of any changes in the state of the input signals during each dead time pulse, so as to perform a subsequent update of the logic control signals, in order to avoid errors in controlling the switches.

Finally, it is clear that modifications and variations may be made to the control module described and illustrated herein without thereby departing from the scope of the present disclosure.

For example, the memory stage 133 may have inputs that directly receive the signals with the asynchronous edges (for example, the signals REG_MODE, OV, PWM and DCM), rather than being connected to the event detector stage 130.

The samplings of the flip-flop 150 of the memory stage 133 may be caused by the falling edges of the signals on the respective clock inputs, rather than by the rising edges.

Embodiments of the type shown in FIG. 3 are also possible, but wherein the memory stage 133 is absent, in which case the OR logic circuit 160 of the pulse generator circuit 132 is also absent; the input of the generator stage 162 is therefore directly connected to the output of the AND logic circuit 148 of the event detector stage 130. In this case, the performances may undergo a decrease, since, as previously explained, the update of the outputs of the synchronization stage 136 may be delayed, in the presence of asynchronous edges that fall within a pulse of the signal sPULSE. For some applications, this possible update delay may still be acceptable.

Figure 14:
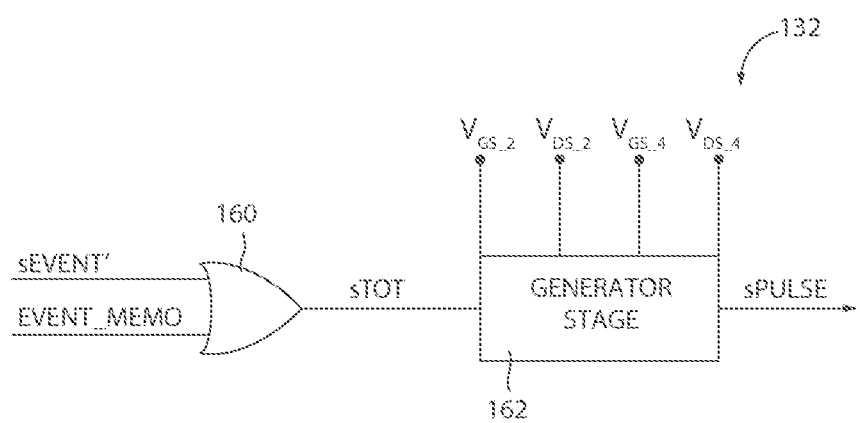

Embodiments are also possible wherein, as shown in FIG. 14, the generator stage 162 also receives at input the voltages $V_{GS}$ and $V_{DS}$ of the top transistor 2 and the bottom transistor 4, which are indicated by $V_{GS\_2}$, $V_{DS\_2}$ and, respectively, $V_{GS\_4}$, $V_{DS\_4}$. In this case, the generator stage 162 is configured to generate the pulses of the signal sPULSE in the same manner previously described, but with the difference that the pulses have a duration that depends on the voltages $V_{GS\_2}$, $V_{DS\_2}$, $V_{GS\_4}$ and $V_{DS\_4}$. For example, it is possible that each pulse of the signal sPULSE is terminated only after the generator stage 162 has detected that the voltages $V_{GS}$ and $V_{DS}$ of the transistor carrying out the on-off transition have reached the corresponding thresholds. In general, this embodiment therefore provides that the dead time $\Delta T$ is variable and is a function of the voltages $V_{GS\_2}$, $V_{DS\_2}$, $V_{GS\_4}$, $V_{DS\_4}$ (as well as of the voltages of other switches, in case the converter includes further switches).

In addition, embodiments are possible wherein one or more of the described signals have inverted polarities with respect to what has been described, i.e. they may be equal to the logical negation of what has been described. Purely by way of example, the signal sPULSE may have positive pulses, i.e. it may normally be equal to '0' and may assume the value '1' during the respective pulses. In this case, the logic control stage 112 modifies accordingly.

In addition, referring for example to the control module 100, the top driving stage 16 and the bottom driving stage 18 may be integrated in the control module 100 or may be formed externally to the control module 100. Similarly, the top transistor 2 and the bottom transistor 4 may also be integrated in the control module 100, or may be formed externally.

Figure 15:
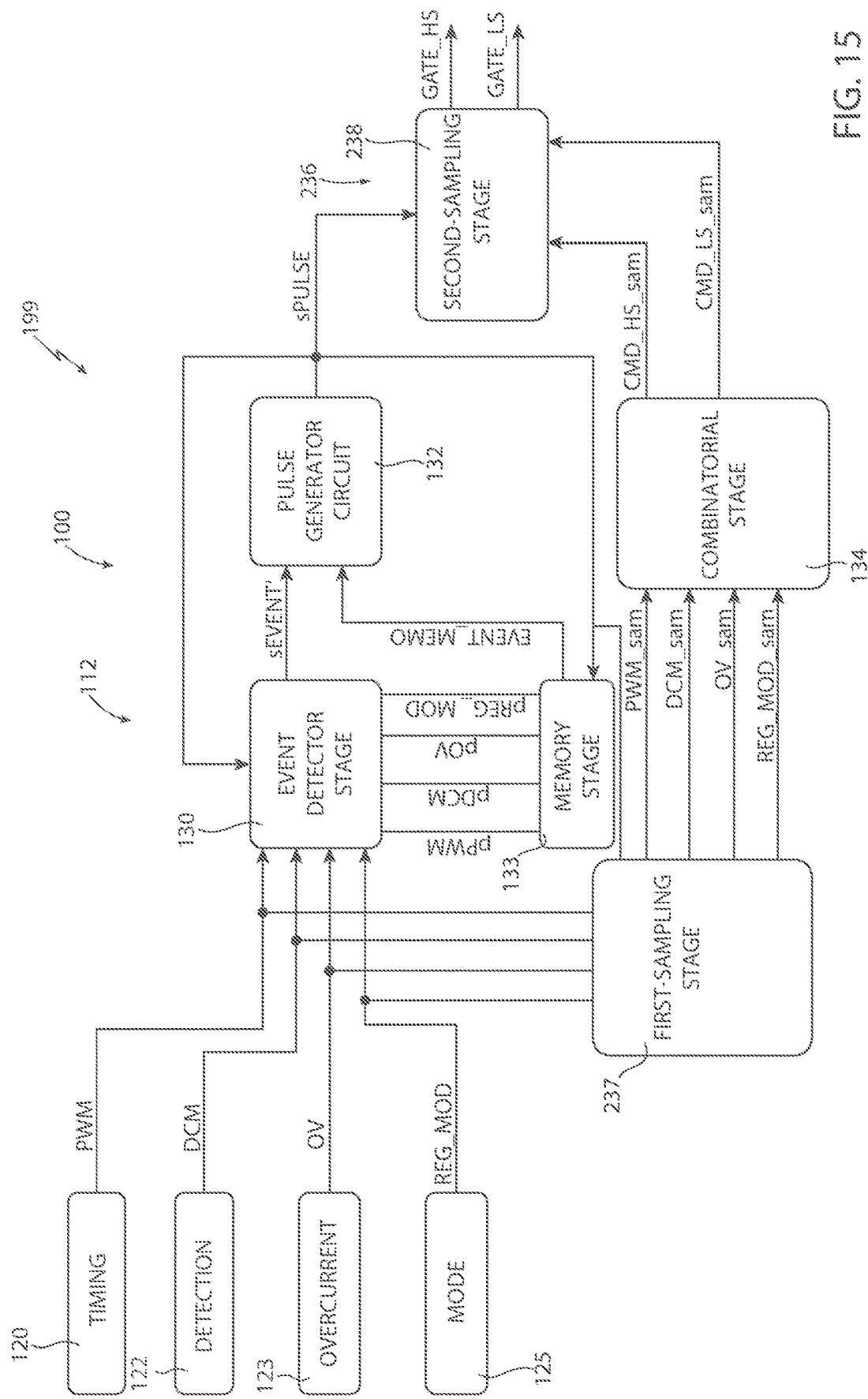
FIG. 15 shows a block diagram of a variant of the controller, in accordance with one or more embodiments.

Furthermore, embodiments are possible wherein the synchronization stage is of the type shown in FIG. 15, which, purely by way of example, shows the control module 100, which forms the converter 199. For this reason, this embodiment is described with reference to the differences with respect to what has been shown in FIG. 3.

In detail, the synchronization stage, indicated by 236, comprises a first-sampling stage 237 and a second-sampling stage 238. The first-sampling stage 237 is interposed between the input circuits (in the present example, and without any loss of generality, the timing circuit 120, the detection circuit 122, the overvoltage detection circuit 123 and the mode adjustment circuit 125) and the combinatorial stage 134; the second-sampling stage 238 is arranged downstream of the combinatorial stage 134.

Figure 16:
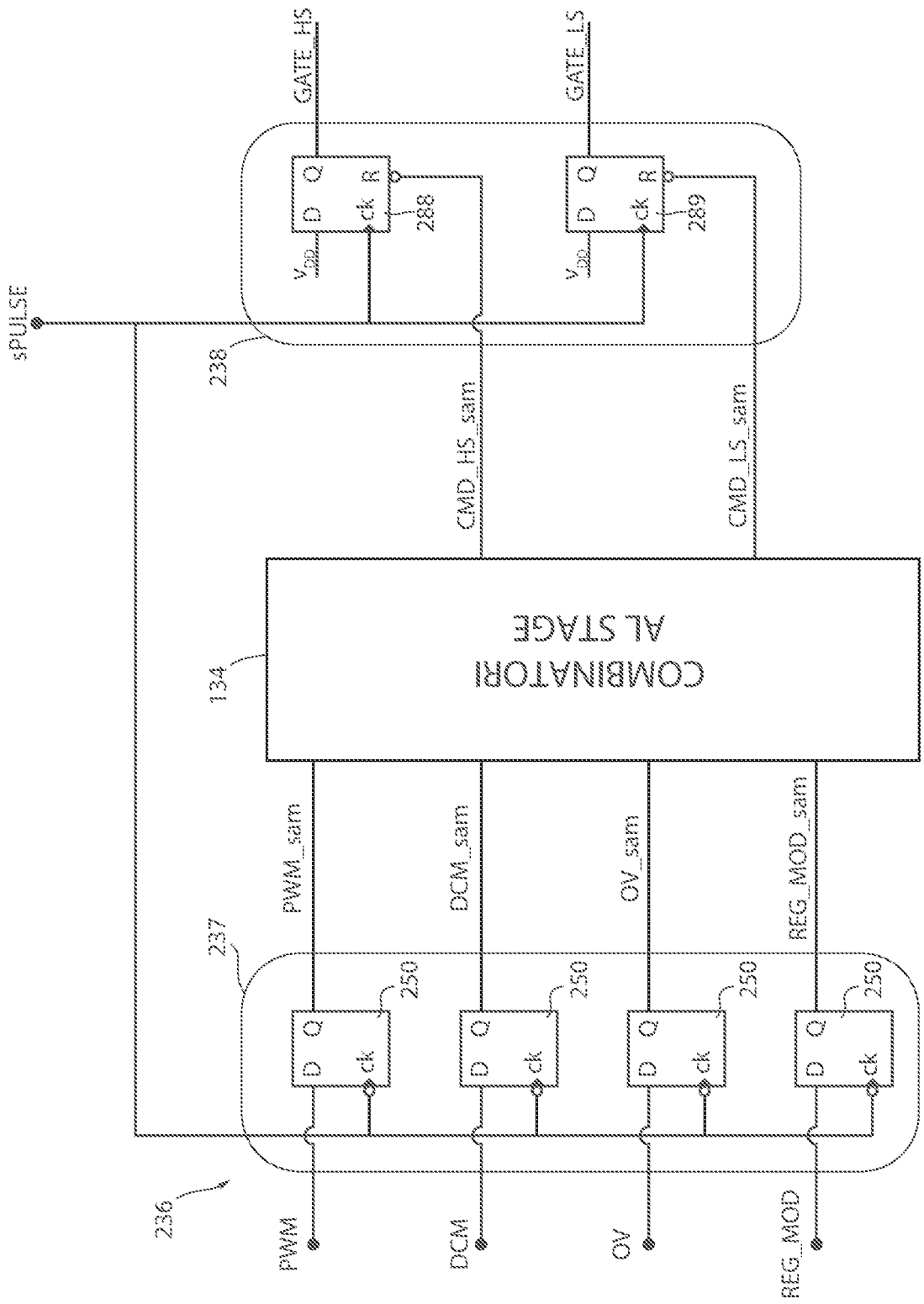
FIG. 16 shows a circuit diagram of a portion of the controller shown in FIG. 15, in accordance with one or more embodiments.

In detail, as shown in FIG. 16, the first-sampling stage 237 comprises four flip-flops 250, which are configured to sample respectively the signals PWM, DCM, OV and REG_MOD, so as to generate, on the respective outputs, signals indicated respectively by PWM_sam, DCM_sam, OV_sam and REG_MOD_sam, which are provided at the input of the combinatorial stage 134.

In greater detail, the flip-flops 250 receive the signal sPULSE on the respective clock inputs; furthermore, the flip-flops 250 are configured to perform the respective samplings at each falling edge of the signal sPULSE.

On the basis of the signals PWM_sam, DCM_sam, OV_sam and REG_MOD_sam and the respective truth table, the combinatorial stage 134 generates the aforementioned signals CMD_HS_sam and CMD_LS_sam. Furthermore, the second-sampling stage 238 comprises a pair of respective flip-flops 288, 289 with negative reset, which are connected to the combinatorial stage 134 so as to receive respectively, on the respective reset inputs, the signal CMD_HS_sam and the signal CMD_LS_sam; furthermore, the signal sPULSE is present on the clock inputs of the flip-flops 288, 289, while the data inputs are set at the reference voltage $V_{DD}$, which represents the logic state '1'.

In use, the flip-flops 288, 289 of the second-sampling stage 238 operate in the same manner as described with reference to the output flip-flops 188, 190 of the synchronization stage 136 and generate, on the respective outputs, the first and, respectively, the second logic control signal GATE_HS, GATE_LS, in the same manner as described with reference to FIG. 9.

In practice, the embodiment shown in FIGS. 15 and 16 is functionally equivalent to the embodiment shown in FIGS. 3 and 9, but the practical implementation thereof is characterized by the presence of less stringent constraints on the propagation times of the signals.

What is claimed is:

1. A controller for an electronic circuit, the electronic circuit comprising:
    a first and a second driving circuit and a first and a second switch connected in series between a power supply node and a node at a reference potential, the first driving circuit being configured to receive a first control signal and to turn on or off the first switch when the first control signal is respectively equal to a first or a second logic value, the second driving circuit being configured to receive a second control signal and to turn on or off the second switch when the second control signal is respectively equal to the first or the second logic value, the controller comprising:
    an event detector circuit configured to receive logic electrical signals including respective edges and a pulse generator circuit, the pulse generator circuit being coupled to the event detector circuit and configured to generate a dead time signal and to control the event detector circuit to operate in a first operating mode or a second operating mode, the event detector circuit being configured to detect an occurrence of the edge of any of the logic electrical signals in the first operating mode, and the event detector circuit being insensitive to the edges of the logic electrical signals in the second operating mode, the pulse generator circuit further configured to generate, when the event detector circuit operates in the first operating mode and following the detection of an edge of any of the logic electrical signals by the event detector circuit, a corresponding pulse of the dead time signal, which is delimited by an edge of a first type and by a subsequent edge of a second type, the pulse generator circuit further configured to control the event detector circuit to operate in the second operating mode during each pulse of the dead time signal and to operate in the first operating mode between pulses of the dead time signal;
    a combinatorial sampling circuit configured to generate, based on a truth table and the logic electrical signals, a first and a second sampled preliminary signal, the first and the second sampled preliminary signals having values that are updated at each edge of the first type of the dead time signal based on the truth table and values of the logic electrical signals at the edge of the first type of the dead time signal; and
    an update circuit coupled to the combinatorial sampling circuit and to the pulse generator circuit and configured to update, at each pulse of the dead time signal, the values of the first and the second control signals, the update comprising:
        with respect to the values of the first or the second sampled preliminary signal relating to a preceding pulse of the dead time signal, in response to a switching having occurred from the first to the second logic value of the first or the second sampled preliminary signal, causing a corresponding switching from the first to the second logic value respectively of the first or the second control signal, subsequently to the edge of the first type of the pulse of the dead time signal; and
        with respect to the values of the first or the second sampled preliminary signal relating to the preceding pulse of the dead time signal, in response to a switching having occurred from the second to the first logic value of the first or the second sampled preliminary signal, causing a corresponding switching from the second to the first logic value respectively of the first or the second control signal, subsequently to the edge of the second type of the pulse of the dead time signal.

2. The controller according to claim 1, further comprising a memory circuit coupled to the pulse generator circuit, the pulse generator circuit further configured to:
    enable the memory circuit, during each pulse of the dead time signal, to detect whether, during the pulse of the dead time signal, one or more edges of the logic electrical signals occur;
    disable the memory circuit between pulses of the dead time signal; and
    generate, when the memory circuit has detected that, during a pulse of the dead time signal, one or more edges of the logic electrical signals have occurred, a new pulse of the dead time signal, after the pulse of the dead time signal has ended.

3. The controller according to claim 2, wherein, when operating in the first operating mode, the event detector circuit is configured to generate, following the detection of the edge of any of the logic electrical signals, a corresponding pulse of a first detection signal, wherein the memory circuit is configured to generate, after each pulse of the dead time signal in which the memory circuit has detected that one or more edges of the logic electrical signals have occurred, a corresponding pulse of a second detection signal, and wherein the pulse generator circuit is configured to receive the first and the second detection signals and to generate a pulse of the dead time signal for each pulse of the first or the second detection signal.

4. The controller according to claim 1, wherein the update circuit comprises a first and a second flip-flop circuit, the first and the second flip-flop circuits having reset inputs configured to receive respectively the first and the second sampled preliminary signals, wherein the first and the second flip-flop circuits are configured to reset when the first and, respectively, the second sampled preliminary signal are equal to the second logic value, wherein the first and the second flip-flop circuits have data inputs set at the first logic value and are configured to perform the respective samplings on the edges of the second type of the dead time signal, and wherein the first and the second flip-flop circuits generate, respectively, the first and the second control signals.

5. The controller according to claim 1, wherein the combinatorial sampling circuit comprises:
   a combinatorial circuit configured to generate, based on the truth table and the logic electrical signals, a first and a second preliminary signal; and
   a sampling circuit configured to generate the first and the second sampled preliminary signal by sampling the first and, respectively, the second preliminary signal at each edge of the first type of the dead time signal.

6. The controller according to claim 1, wherein the combinatorial sampling circuit comprises:
   a sampling circuit configured to generate a plurality of preliminary signals by sampling the logic electrical signals at each edge of the first type of the dead time signal; and
   a combinatorial circuit coupled to the sampling circuit and configured to generate the first and the second sampled preliminary signals based on the truth table and the preliminary signals.

7. The controller according to claim 1, wherein the controller includes a timing circuit, a detection circuit, an overvoltage detection circuit, a mode adjustment circuit, a sensor, a current amplifier.

8. A switching converter, comprising:
   a first driving circuit configured to receive a first control signal and to control a first switch based on the first control signal having a first or a second logic value;
   a second driving circuit configured to receive a second control signal and to control a second switch based on the second control signal having the first or the second logic value, the first and second switches connected in series between a power supply node and a node at a reference potential; and
   a controller configured to receive logic electrical signals including, the controller comprising:
      an event detector circuit and a pulse generator circuit, the pulse generator circuit being coupled to the event detector circuit and configured to generate a dead time signal and to control the event detector circuit to operate in a first operating mode or a second operating mode, the event detector circuit being configured to detect an occurrence of an edge of any of the logic electrical signals in the first operating mode, and the event detector circuit being insensitive to the edges of the logic electrical signals in the second operating mode, the pulse generator circuit further configured to generate, in response to the event detector circuit detecting the edge of any of the logic electrical signals in the first operating mode, a corresponding pulse of the dead time signal having a first edge of a first type and a subsequent second edge of a second type, the pulse generator circuit further configured to control the event detector circuit to operate in the second operating mode during each pulse of the dead time signal and to operate in the first operating mode between pulses of the dead time signal;
      a combinatorial sampling circuit configured to generate, based on a truth table and the logic electrical signals, a first and a second sampled preliminary signal, the first and the second sampled preliminary signals having values that are updated at each edge of the first type of the dead time signal based on the truth table and values of the logic electrical signals at the edge of the first type of the dead time signal; and
      an update circuit coupled to the combinatorial sampling circuit and to the pulse generator circuit and configured to update, at each pulse of the dead time signal, the values of the first and the second control signals, the update comprising:
         in response to a switching having occurred from the first to the second logic value of the first or the second sampled preliminary signal, causing a corresponding switching from the first to the second logic value of the first or the second control signal, subsequently to the edge of the first type of the pulse of the dead time signal; and
         in response to a switching having occurred from the second to the first logic value of the first or the second sampled preliminary signal, causing a corresponding switching from the second to the first logic value of the first or the second control signal, subsequently to the edge of the second type of the pulse of the dead time signal.

9. The switching converter according to claim 8, wherein the switching converter includes the first and the second switches.

10. The switching converter according to claim 8, wherein the controller further comprises a memory circuit coupled to the pulse generator circuit, the pulse generator circuit being further configured to:
   enable the memory circuit, during each pulse of the dead time signal, to detect whether, during the pulse of the dead time signal, one or more edges of said logic electrical signals occur;
   disable the memory circuit between pulses of the dead time signal; and
   generate, when the memory circuit has detected that, during a pulse of the dead time signal, one or more edges of the logic electrical signals have occurred, a new pulse of the dead time signal, after the pulse of the dead time signal has ended.

11. The switching converter according to claim 10, wherein, when operating in the first operating mode, the event detector circuit is configured to generate, following the detection of the edge of any of the logic electrical signals, a corresponding pulse of a first detection signal, wherein the memory circuit is configured to generate, after each pulse of the dead time signal in which the memory circuit has detected that one or more edges of the logic electrical signals have occurred, a corresponding pulse of a second detection signal, and wherein the pulse generator circuit is configured to receive the first and the second detection signals and to generate a pulse of the dead time signal for each pulse of the first or the second detection signal.

12. The switching converter according to claim 8, wherein the update circuit comprises a first and a second flip-flop circuit, the first and the second flip-flop circuits having reset inputs configured to receive respectively the first and the second sampled preliminary signals, wherein the first and the second flip-flop circuits are configured to reset when the first and, respectively, the second sampled preliminary signal are equal to the second logic value, wherein the first and the second flip-flop circuits have data inputs set at the first logic value and are configured to perform the respective samplings on the edges of the second type of the dead time signal, and wherein the first and the second flip-flop circuits generate, respectively, the first and the second control signals.

13. The switching converter according to claim 8, wherein the combinatorial sampling circuit comprises:
   a combinatorial circuit configured to generate, based on the truth table and the logic electrical signals, a first and a second preliminary signal; and
   a sampling circuit configured to generate the first and the second sampled preliminary signal by sampling the first and, respectively, the second preliminary signal at each edge of the first type of the dead time signal.

14. The switching converter according to claim 8, wherein the combinatorial sampling circuit comprises:
   a sampling circuit configured to generate a plurality of preliminary signals by sampling the logic electrical signals at each edge of the first type of the dead time signal; and
   a combinatorial circuit coupled to the sampling circuit and configured to generate the first and the second sampled preliminary signals based on truth table and the preliminary signals.

15. A method for controlling an electronic circuit, the method comprising:
   receiving a plurality of logic electrical signals including respective edges;
   controlling an event detector circuit to operate in a first operating mode or a second operating mode, the event detector circuit being configured to detect an occurrence of an edge of any of the logic electrical signals in the first operating mode, and the event detector circuit being insensitive to the edges of the logic electrical signals in the second operating mode;
   generating a dead time signal, the generating the dead time signal including generating, when the event detector circuit operates in the first operating mode and following the detection of an edge of any of the logic electrical signals by the event detector circuit, a corresponding pulse of the dead time signal, which is delimited by an edge of a first type and by a subsequent edge of a second type;
   controlling the event detector to operate in the second operating mode during each pulse of the dead time signal and to operate in the first operating mode between pulses of the dead time signal;
   generating, based on a truth table and the logic electrical signals, a first and a second sampled preliminary signal, the first and the second sampled preliminary signals having values that are updated at each edge of the first type of the dead time signal based on the truth table and values of the logic electrical signals at the edge of the first type of the dead time signal; and
   generating a first and a second control signal based on the first and, respectively, the second sampled preliminary signal, the electronic circuit including a first driving circuit configured to control a first switch based on the first control signal having a first or a second logic value and a second driving circuit configured to control a second switch based on the second control signal having the first or the second logic value,
   wherein generating the first and second control signals comprises updating, at each pulse of the dead time signal, the values of the first and the second control signals, the updating comprising:
      in response to a switching having occurred from the first to the second logic value of the first or the second sampled preliminary signal, causing a corresponding switching from the first to the second logic value of the first or the second control signal, subsequently to the edge of the first type of the pulse of the dead time signal; and
      in response to a switching having occurred from the second to the first logic value of the first or the second sampled preliminary signal, causing a corresponding switching from the second to the first logic value of the first or the second control signal, subsequently to the edge of the second type of the pulse of the dead time signal.

16. The method according to claim 15, further comprising:
   enabling a memory circuit, during each pulse of the dead time signal, to detect whether, during the pulse of the dead time signal, one or more edges of the logic electrical signals occur; and
   disabling the memory circuit between pulses of the dead time signal,
   wherein generating the dead time signal further comprises generating, when the memory circuit has detected that, during a pulse of the dead time signal, one or more edges of the logic electrical signals have occurred, a new pulse of the dead time signal, after the pulse of the dead time signal has ended.

17. The method according to claim 16, wherein, when operating in the first operating mode, the event detector circuit is configured to generate, following the detection of the edge of any of the logic electrical signals, a corresponding pulse of a first detection signal, wherein the memory circuit is configured to generate, after each pulse of the dead time signal in which the memory circuit has detected that one or more edges of the logic electrical signals have occurred, a corresponding pulse of a second detection signal, the method further comprising generating a pulse of the dead time signal for each pulse of the first or the second detection signal.

18. The method according to claim 15, wherein generating the first and the second sampled preliminary signal comprises:
   generating, based on the truth table and the logic electrical signals, a first and a second preliminary signal; and
   generating the first and the second sampled preliminary signals by sampling the first and, respectively, the second preliminary signal at each edge of the first type of the dead time signal.

19. The method according to claim 15, wherein generating the first and the second sampled preliminary signal comprises:
   generating a plurality of preliminary signals by sampling the logic electrical signals at each edge of the first type of the dead time signal; and
   generating the first and the second sampled preliminary signals based on the truth table and the preliminary signals.

20. The method according to claim 15, wherein the electronic circuit is a switching converter.

* * * * *

UNITED STATES PATENT AND TRADEMARK OFFICE
CERTIFICATE OF CORRECTION

| | | |
|---|---|---|
| PATENT NO. | : 12,362,735 B2 | Page 1 of 1 |
| APPLICATION NO. | : 18/451262 | |
| DATED | : July 15, 2025 | |
| INVENTOR(S) | : Floriani et al. | |

It is certified that error appears in the above-identified patent and that said Letters Patent is hereby corrected as shown below:

On the Title Page

Item (71), in Column 1, in "Applicant", Line 1, delete "S.r.I.," and insert -- S.r.l., --.

In the Claims

In Column 21, in Claim 8, Lines 44-45, delete "signals including," and insert -- signals, --.

Signed and Sealed this
Second Day of September, 2025

Coke Morgan Stewart
*Acting Director of the United States Patent and Trademark Office*